US009530785B1

(12) United States Patent
Koka et al.

(10) Patent No.: US 9,530,785 B1
(45) Date of Patent: Dec. 27, 2016

(54) THREE-DIMENSIONAL MEMORY DEVICES HAVING A SINGLE LAYER CHANNEL AND METHODS OF MAKING THEREOF

(71) Applicant: SanDisk Technologies, Inc., Plano, TX (US)

(72) Inventors: Sateesh Koka, Milpitas, CA (US); Zhenyu Lu, Milpitas, CA (US); Wei Zhao, Milpitas, CA (US); Ching-Huang Lu, Fremont, CA (US); Henry Chien, San Jose, CA (US); Yingda Dong, San Jose, CA (US); Raghuveer S. Makala, Campbell, CA (US); Somesh Peri, San Jose, CA (US); Rahul Sharangpani, Fremont, CA (US); George Matamis, Danville, CA (US); Yuichi Ikezono, Yokkaichi (JP); Hiroyuki Ogawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/804,564

(22) Filed: Jul. 21, 2015

(51) Int. Cl.
*H01L 29/76* (2006.01)
*H01L 27/115* (2006.01)

(52) U.S. Cl.
CPC ..... *H01L 27/1157* (2013.01); *H01L 27/11524* (2013.01); *H01L 27/11556* (2013.01); *H01L 27/11582* (2013.01)

(58) Field of Classification Search
CPC ............ H01L 27/1157; H01L 27/11524; H01L 27/11556; H01L 27/11582
(Continued)

(56) References Cited

U.S. PATENT DOCUMENTS 5,915,167 A 6/1999 Leedy
7,177,191 B2 2/2007 Fasoli et al.
(Continued)

FOREIGN PATENT DOCUMENTS

WO WO02/15277 A2 2/2002
WO WO2012/003301 A2 1/2012

OTHER PUBLICATIONS

Jang et al., "Vertical Cell Array Using Tcat (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
(Continued)

*Primary Examiner* — Xinning Niu
*Assistant Examiner* — Vu A Vu
(74) *Attorney, Agent, or Firm* — The Marbury Law Group PLLC

(57) ABSTRACT

A memory stack structure for a three-dimensional device includes an alternating stack of insulator layers and spacer material layers. A memory opening is formed through the alternating stack. A memory material layer, a tunneling dielectric layer, and a silicon oxide liner are formed in the memory opening. A sacrificial liner is subsequently formed over the tunneling dielectric layer. The layer stack is anisotropically etched to physically expose a semiconductor surface of the substrate underneath the memory opening. The sacrificial liner may be removed prior to, or after, the anisotropic etch. The silicon oxide liner is removed after the anisotropic etch. A semiconductor channel layer can be deposited directly on the tunneling dielectric layer as a single material layer without any interface therein.

25 Claims, 19 Drawing Sheets

(58) Field of Classification Search
USPC .......................................................... 257/314
See application file for complete search history.

(56) References Cited

U.S. PATENT DOCUMENTS

| | | | |
|---|---|---|---|
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,053,829 B2 | 11/2011 | Kang et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,349,681 B2 | 1/2013 | Alsmeier et al. | |
| 8,614,126 B1 | 12/2013 | Lee et al. | |
| 8,658,499 B2 | 2/2014 | Makala et al. | |
| 8,884,357 B2 | 11/2014 | Wang et al. | |
| 8,946,023 B2 | 2/2015 | Makala et al. | |
| 9,023,719 B2 | 5/2015 | Pachamuthu et al. | |
| 2007/0210338 A1 | 9/2007 | Orlowski | |
| 2007/0252201 A1 | 11/2007 | Kito et al. | |
| 2008/0169567 A1 | 7/2008 | Kai et al. | |
| 2009/0283819 A1 | 11/2009 | Ishikawa et al. | |
| 2010/0044776 A1 | 2/2010 | Ishiduki et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim | |
| 2010/0155818 A1 | 6/2010 | Cho et al. | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2011/0281429 A1* | 11/2011 | Ganguly | H01L 21/28282 438/591 |
| 2011/0291178 A1 | 12/2011 | Sasaki et al. | |
| 2012/0001247 A1 | 1/2012 | Alsmeier | |
| 2012/0001249 A1 | 1/2012 | Alsmeier et al. | |
| 2012/0001252 A1 | 1/2012 | Alsmeier et al. | |
| 2012/0068247 A1 | 3/2012 | Lee et al. | |
| 2012/0146127 A1 | 6/2012 | Lee et al. | |
| 2012/0153372 A1 | 6/2012 | Kim et al. | |
| 2012/0156848 A1 | 6/2012 | Yang et al. | |
| 2012/0256247 A1 | 10/2012 | Alsmeier | |
| 2013/0134492 A1 | 5/2013 | Yang et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0225181 A1 | 8/2014 | Makala et al. | |
| 2014/0252443 A1* | 9/2014 | Kawai | H01L 27/1157 257/314 |
| 2014/0264525 A1 | 9/2014 | Takahashi et al. | |
| 2014/0264533 A1 | 9/2014 | Simsek-Ege et al. | |
| 2014/0264542 A1 | 9/2014 | Simsek-Ege et al. | |
| 2014/0273373 A1 | 9/2014 | Makala et al. | |
| 2014/0295636 A1 | 10/2014 | Makala et al. | |
| 2014/0353738 A1 | 12/2014 | Makala et al. | |
| 2015/0008503 A1 | 1/2015 | Makala et al. | |
| 2015/0076580 A1 | 3/2015 | Pachamuthu et al. | |
| 2015/0076584 A1 | 3/2015 | Pachamuthu et al. | |
| 2015/0179660 A1 | 6/2015 | Yada et al. | |

OTHER PUBLICATIONS

Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, Masahide "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li et al., "Sacrificial Polymers for Nanofluidic Channels in Biological Applications", Nanotechnology 14 (2003) 578-583.
Invitation to Pay Additional Fees, including Annex to Form PCT/ISA/206 Communication Relating to The Results of the Partial International Search for PCT/US2014/048160, issued on Oct. 31, 2014.
International Search Report & Written Opinion received in connection with international application PCT/US2014/032123, dated Sep. 22, 2014.
Non-Final Office Action for U.S. Appl. No. 14/539,307, issued Jul. 17, 2015, 19 sheets.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Trowbridge et al., "Enhanced Oxidation of Silicon Nitride Using in Situ Steam Generation," 199th ECS Conf. vol. 2000. 2001.
Invitation to Pay Additional Fees and International Searching Authority including Communication Relating to the Results of the Partial International Search for PCT/US2014/047480 mailed Oct. 7, 2014.
International Search Report and Written Opinion received in connection with international Application No. PCT/US2014/047480; mailed Jan. 5, 2015.
Notice of Allowance and Fee(s) Due for U.S. Appl. No. 14/225,116, filed Mar. 25, 2014 (12 pages).
U.S. Appl. No. 14/523,287, filed Oct. 24, 2014, SanDisk Technologies, Inc.
U.S. Appl. No. 14/539,307, filed Nov. 12, 2014, SanDisk Technologies, Inc.
U.S. Appl. No. 14/539,372, filed Nov. 12, 2014, SanDisk Technologies, Inc.
U.S. Appl. No. 61/977,173, filed Apr. 9, 2014, Pachamuthu et al.
U.S. Appl. No. 14/260,674, filed Feb. 12, 2015, SanDisk Technologies, Inc.

* cited by examiner

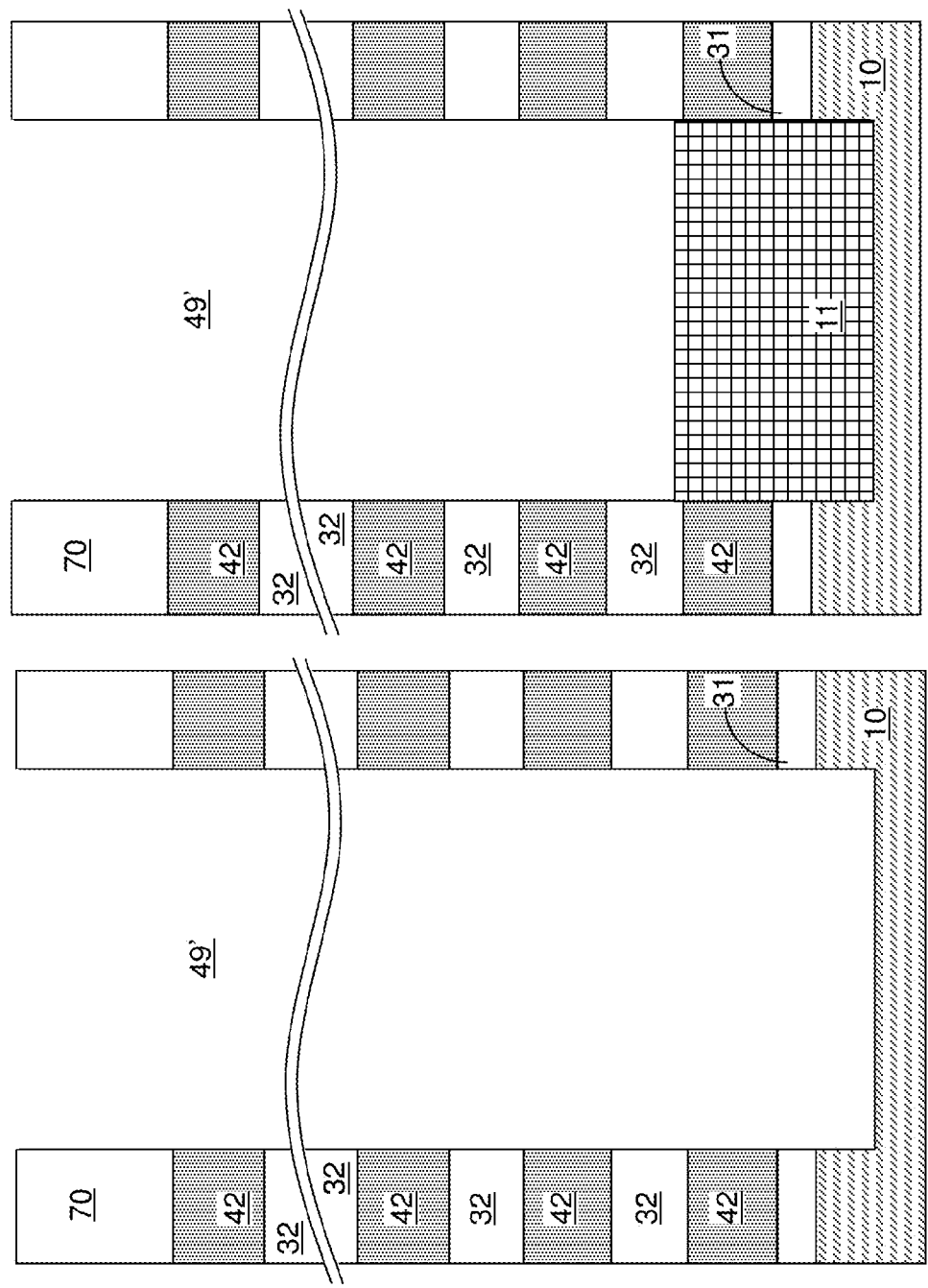

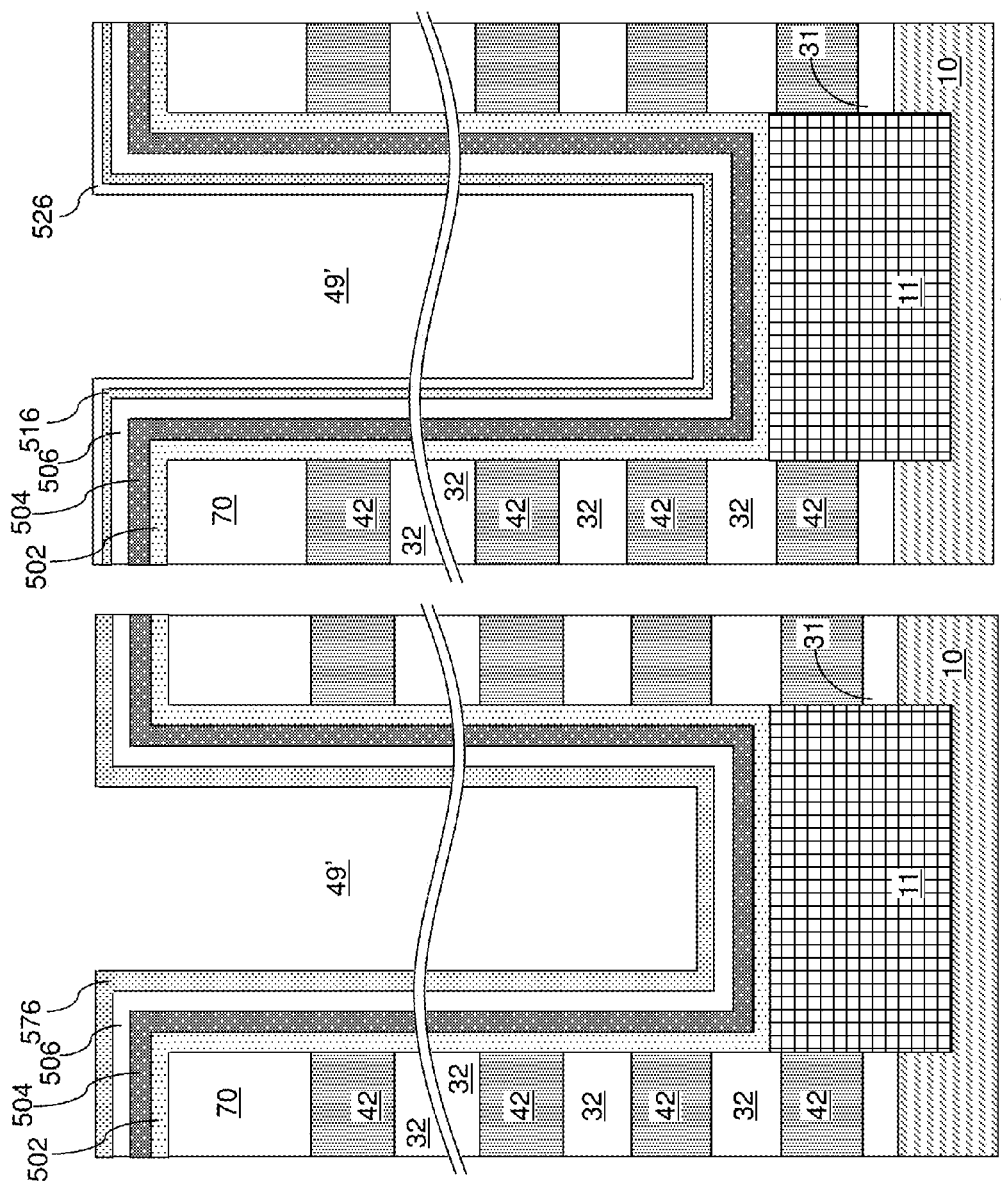

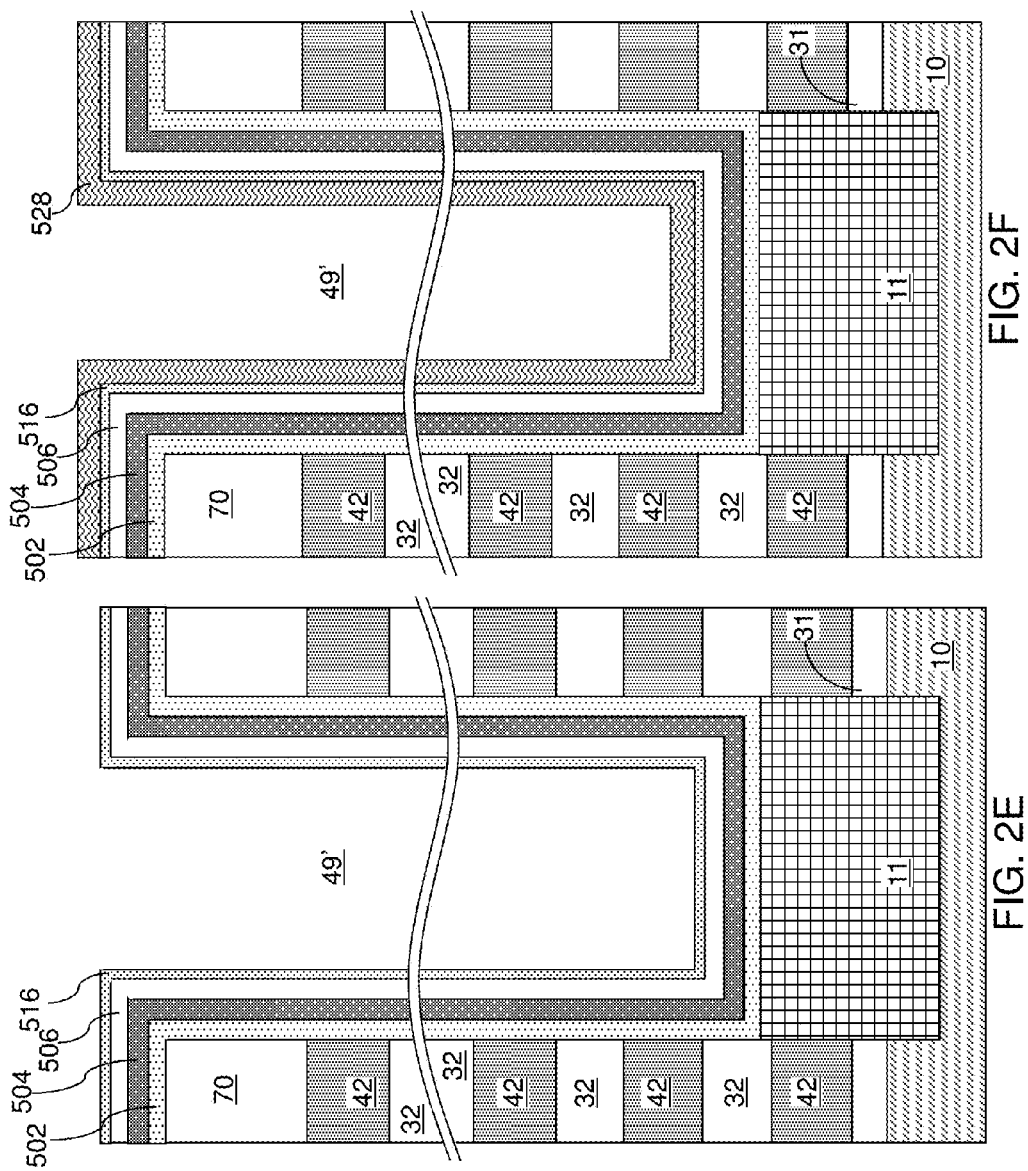

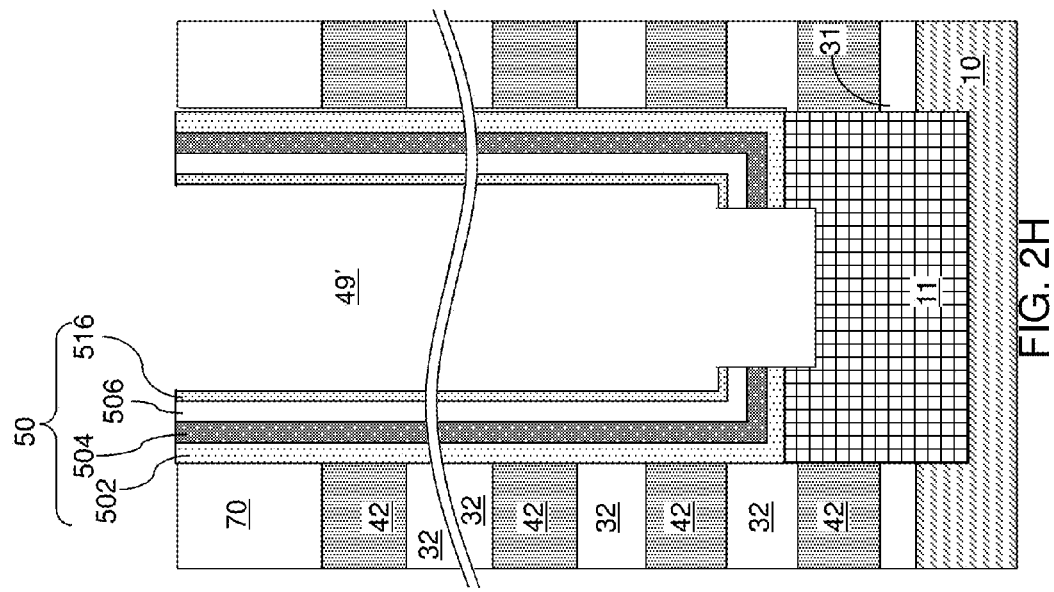
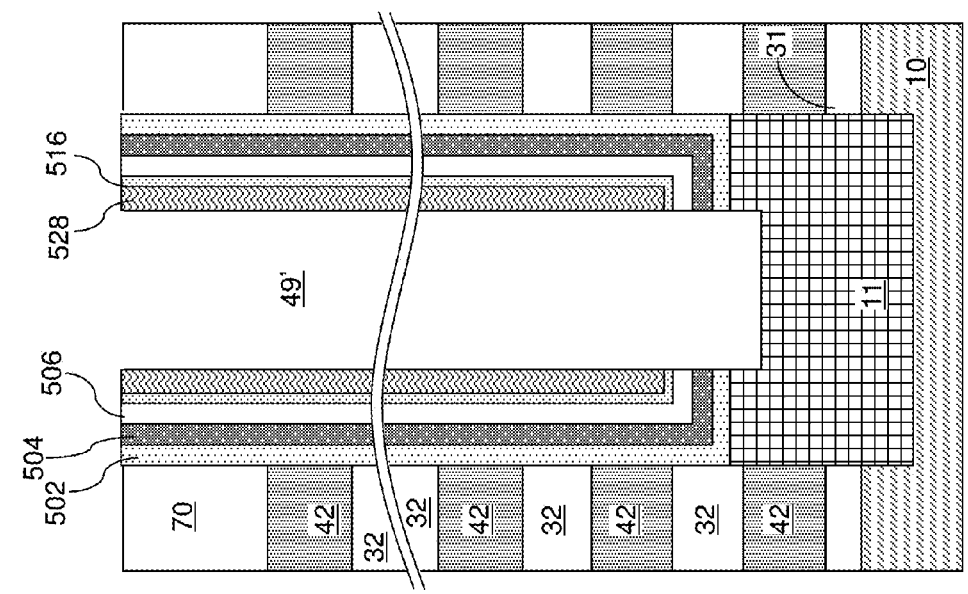

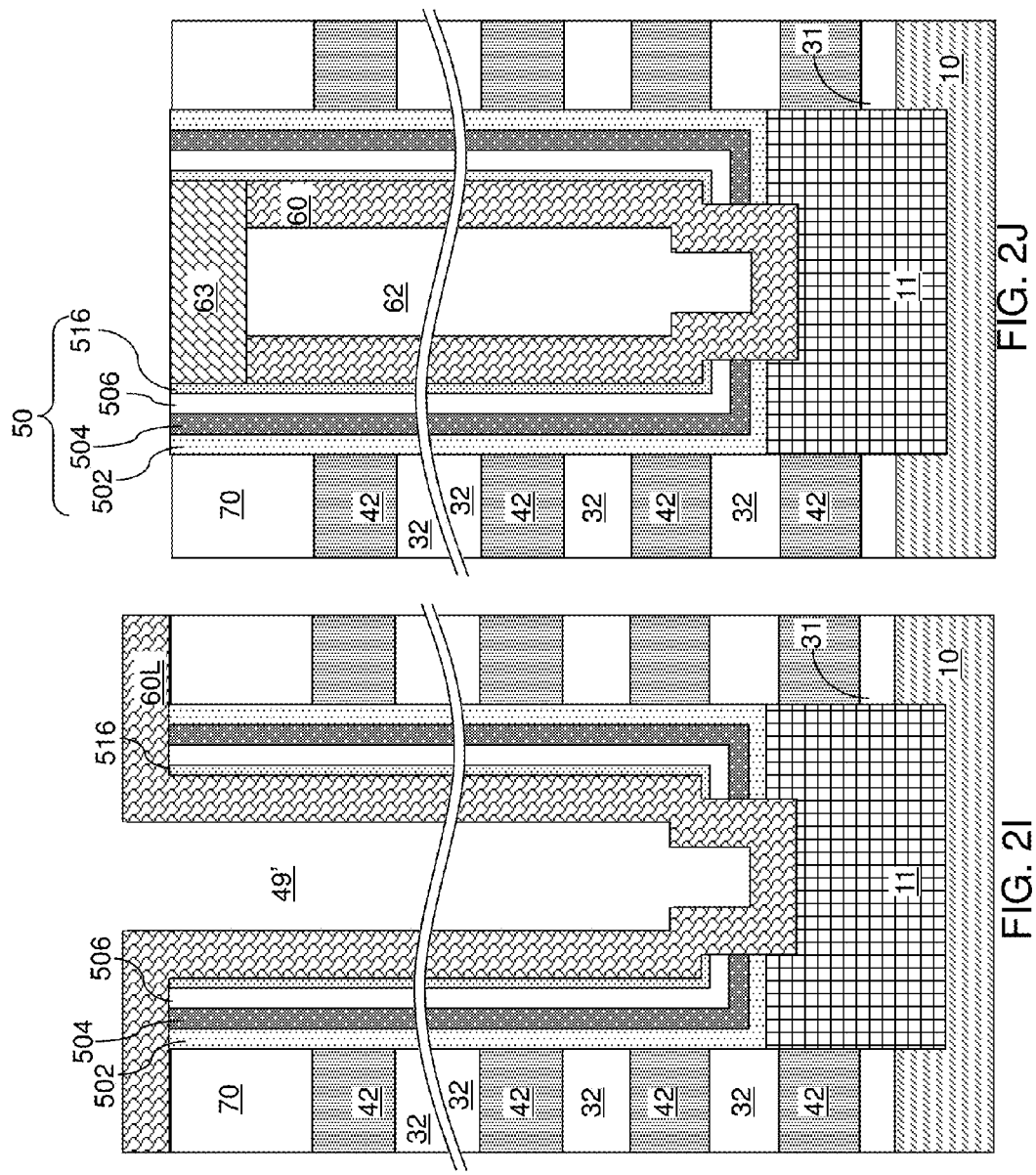

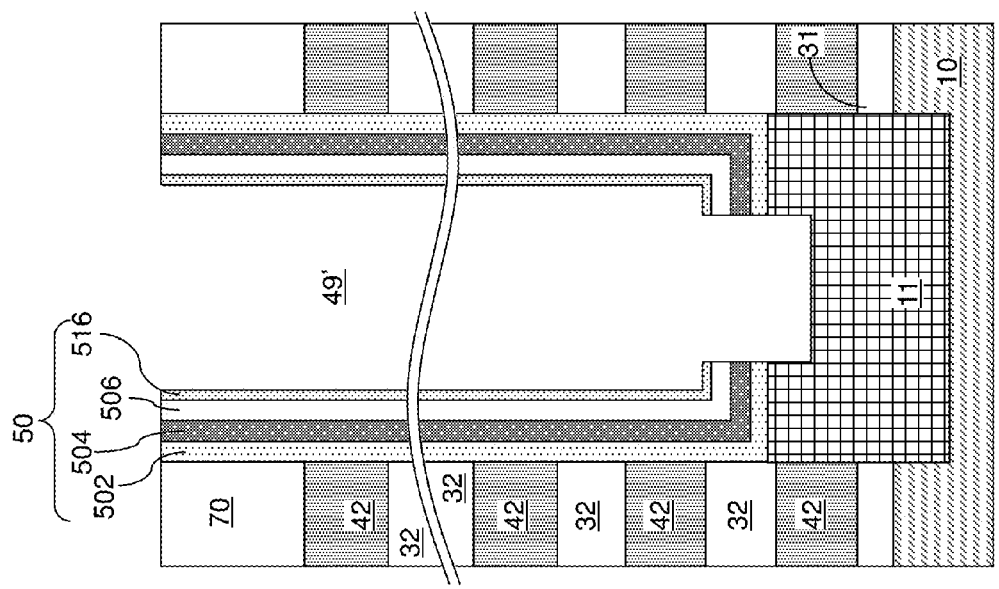
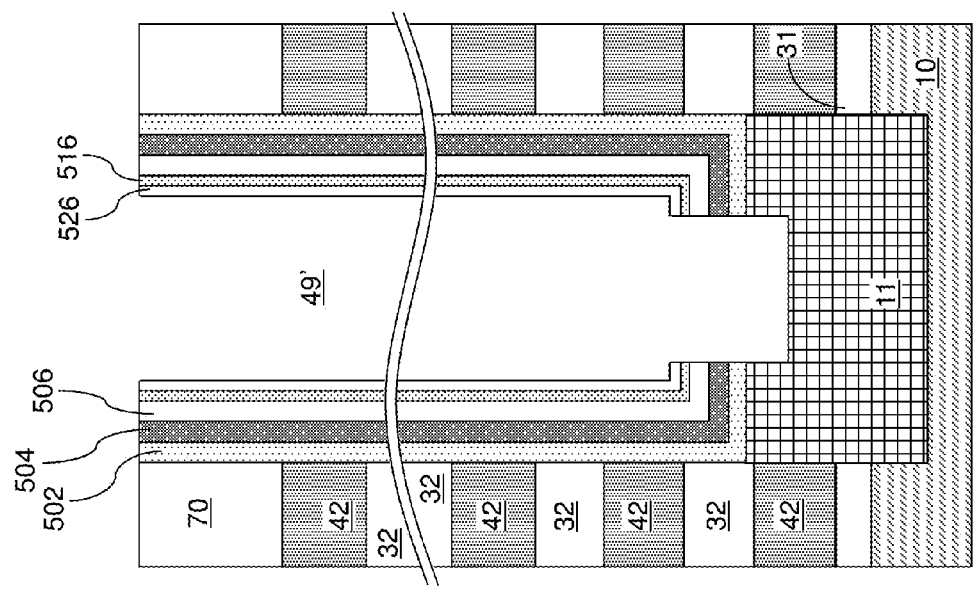

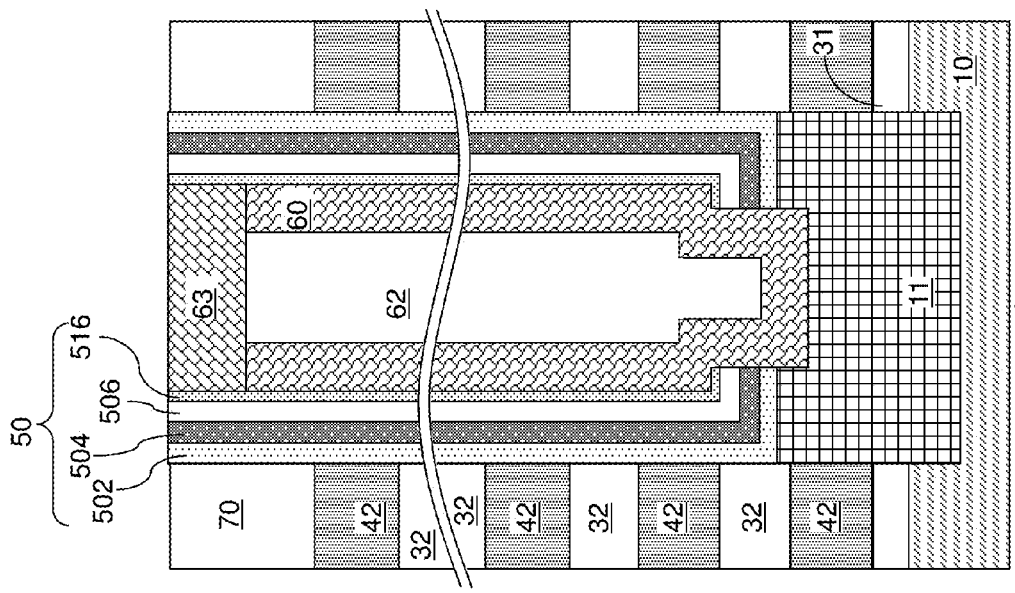
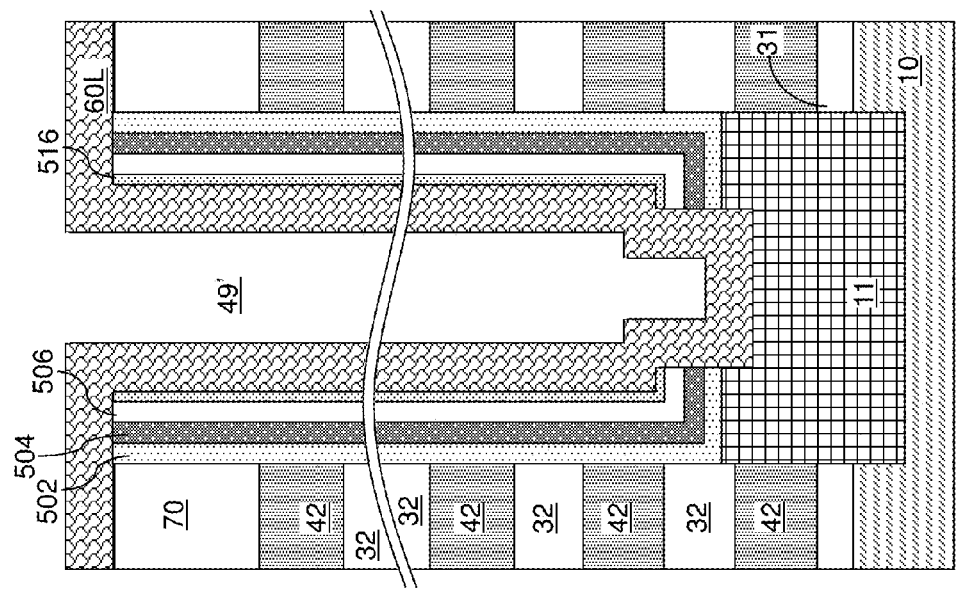

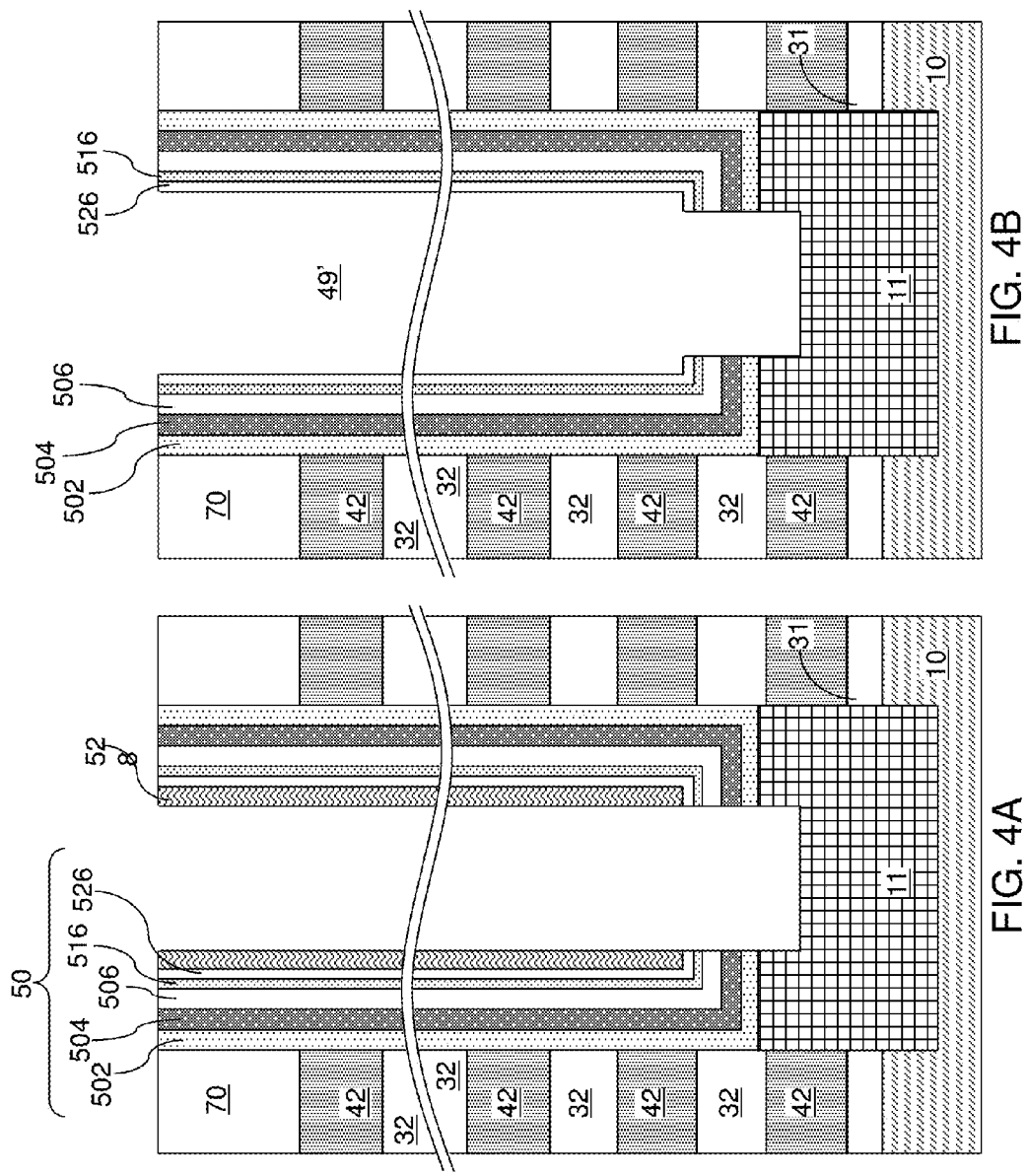

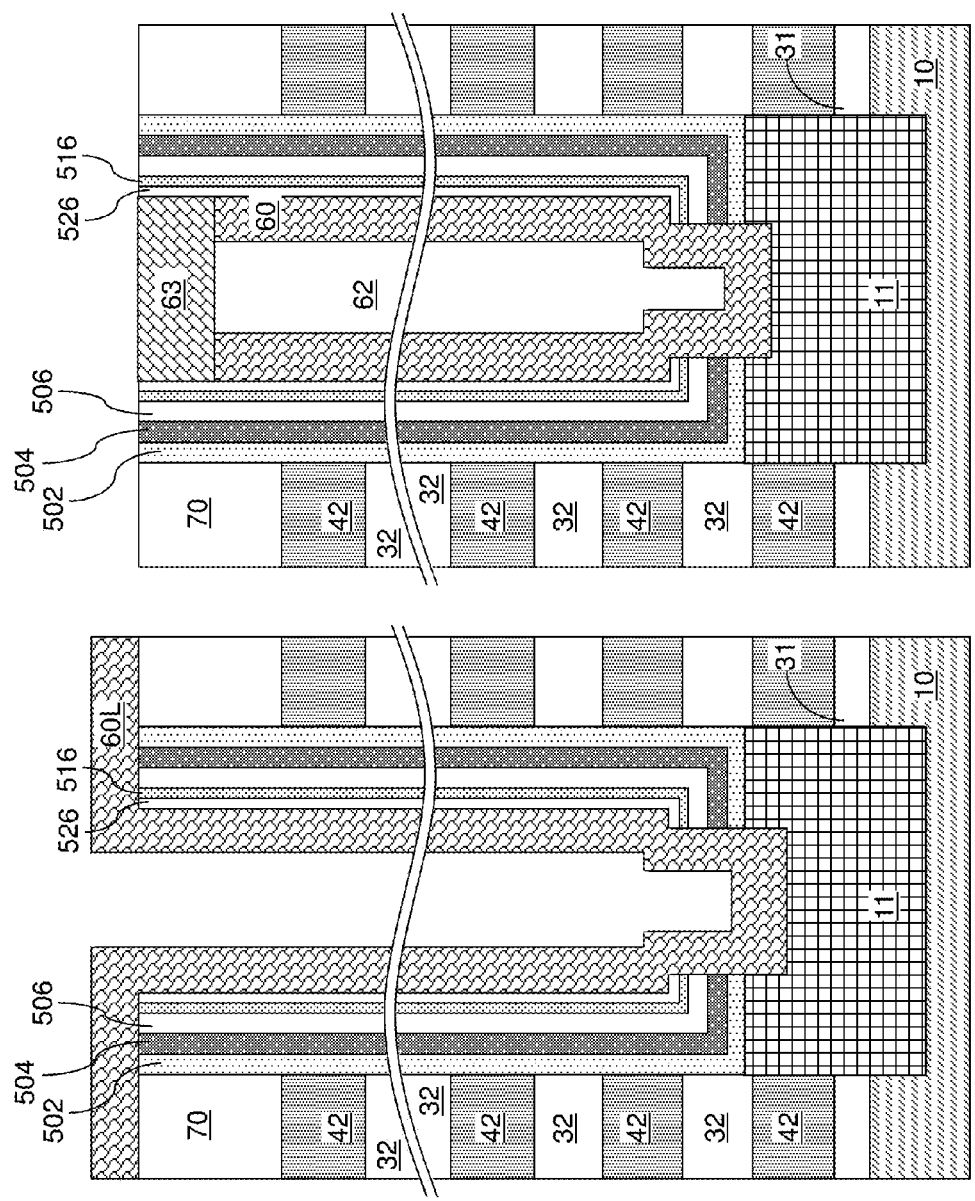

THREE-DIMENSIONAL MEMORY DEVICES HAVING A SINGLE LAYER CHANNEL AND METHODS OF MAKING THEREOF

FIELD

The present disclosure relates generally to the field of semiconductor devices and specifically three-dimensional semiconductor devices, such as vertical NAND strings, and methods of making thereof.

BACKGROUND

A dual layer semiconductor channel employed for vertical memory devices provides the benefit of protecting an underlying memory film, and particularly the tunneling dielectric therein, during an anisotropic etch that removes a bottom portion of the memory film to physically expose surfaces of a semiconductor substrate that includes horizontal portions of semiconductor channels. A first semiconductor channel layer is deposited prior to the anisotropic etch over the tunneling dielectric, and a second semiconductor channel layer is deposited after the anisotropic etch directly on a surface of the semiconductor substrate and on remaining vertical portions of the first semiconductor channel layer. A semiconductor channel including vertical portions of the first semiconductor channel layer and the second semiconductor channel layer includes an interface between the two semiconductor channel layers. The interface between the two semiconductor channel layers may generate interface states, which scatter charge carriers in the semiconductor channel, and reduce the mobility of charge carriers and the on-current of the vertical memory device.

SUMMARY

According to an aspect of the present disclosure, a method of manufacturing a semiconductor device is provided. A stack of alternating layers comprising insulating layers and spacer material layers is formed over a substrate. A memory opening is formed through the stack. A memory material layer and a first tunneling dielectric sub-layer are formed over the memory material layer in the memory opening. A stack of a second tunneling dielectric sub-layer and a silicon oxide liner is formed over the first tunneling dielectric sub-layer in the memory opening. A sacrificial liner is formed in the memory opening. A layer stack including at least the sacrificial liner, a tunneling dielectric layer, and the memory material layer is anisotropically etched to physically expose a semiconductor surface underneath the memory opening. The tunneling dielectric layer includes at least a combination of the first and second tunneling dielectric sub-layers. The sacrificial liner is removed. A semiconductor channel layer is deposited directly on the tunneling dielectric layer.

According to another aspect of the present disclosure, a monolithic three-dimensional memory device is provided, which comprises a stack of alternating layers comprising insulator layers and electrically conductive layers and located over a semiconductor substrate; and a memory stack structure extending through the stack of alternating layers. The memory stack structure comprises a memory material layer, a tunneling dielectric layer. A semiconductor channel is located within the memory stack structure. The tunneling dielectric layer comprises an ONO stack and a silicon nitride layer that contacts the semiconductor channel.

BRIEF DESCRIPTION OF THE DRAWINGS

FIGS. 2A-2J are sequential vertical cross-sectional views of a memory opening within the exemplary structure during various processing steps employed to form a first exemplary memory stack structure according to an embodiment of the present disclosure.

FIGS. 3A-3F are sequential vertical cross-sectional views of a memory opening within the exemplary structure during various processing steps employed to form a second exemplary memory stack structure according to an embodiment of the present disclosure.

FIGS. 4A-4D are sequential vertical cross-sectional views of a memory opening within the exemplary structure during various processing steps employed to form a third exemplary memory stack structure according to an embodiment of the present disclosure.

DETAILED DESCRIPTION

Figure 1:
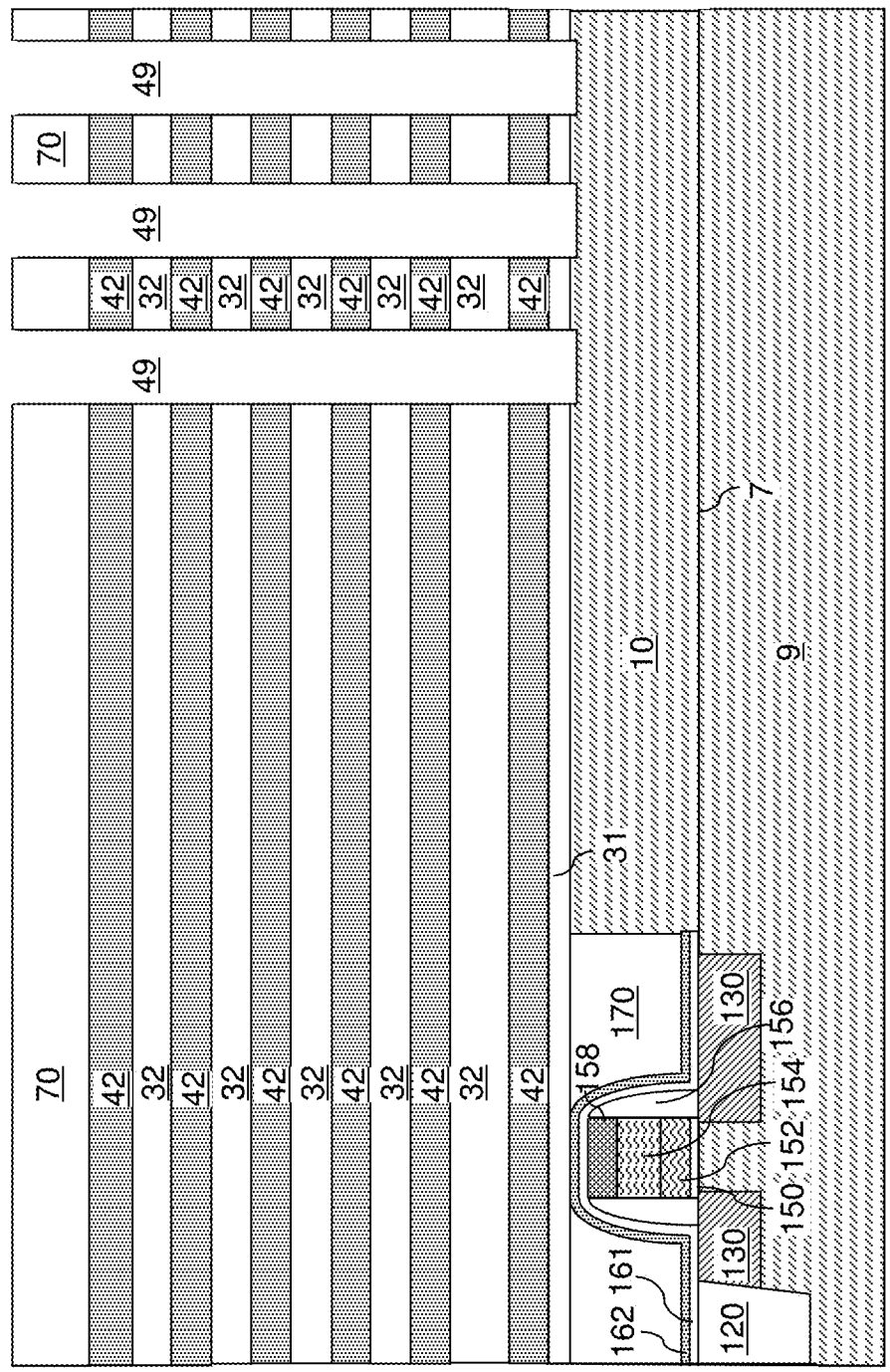
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A planar dielectric layer 31 can be formed above the semiconductor material layer 10. The planar dielectric layer 31 can be a gate dielectric layer that vertically separates horizontal portions of semiconductor channels in an upper portion of the semiconductor material layer 10 and select gate electrodes to be subsequently formed by replacing a bottommost sacrificial material layer 42. The planar dielectric layer 31 can be, for example, a silicon oxide layer, a dielectric metal oxide layer, or a combination thereof. The thickness of the planar dielectric layer 31 can be in a range from 1 nm to 10 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the planar dielectric layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer that provides vertical separation between a vertically neighboring pair of insulator layers 32.

In one embodiment, the spacer material layers can be permanent layers that are not subsequently replaced with a different material. In this case, the spacer material layers can include a conductive material such as doped semiconductor material (such as doped polysilicon or a doped silicon-containing alloy). Alternatively, each first material layer can be an insulating layer 32, and. each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the planar dielectric layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the planar dielectric layer 31 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2J illustrate sequential vertical cross-sectional views of a memory opening within the exemplary structure during formation of a first exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the planar dielectric layer 31, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer 502, a memory material layer 504, a first tunneling dielectric sub-layer 506, and an in-process conformal dielectric material layer 576 can be sequentially deposited in the memory openings 49. A portion of the in-process second dielectric material layer 576 becomes a second tunneling dielectric sub-layer, while another portion of the in-process conformal dielectric material layer 576 becomes a silicon oxide liner by a conversion process such as an oxidation process.

The at least one blocking dielectric layer 502 can include a single dielectric material layer or a plurality of dielectric material layers. The at least one blocking dielectric layer 502 can be deposited on the sidewalls of each memory opening 49 by a conformal deposition method. In one embodiment, the at least one blocking dielectric layer 502 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the at least one blocking dielectric layer 502 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The at least one blocking dielectric layer 502 can be deposited, for example, by chemical vapor deposition (CVD), atomic layer deposition (ALD), pulsed laser deposition (PLD), liquid source misted chemical deposition, or a combination thereof. The thickness of the at least one blocking dielectric layer 502 can be in a range from 1 nm to 20 nm, although lesser and greater thicknesses can also be employed. The at least one blocking dielectric layer 502 can subsequently function as a dielectric material portion that blocks leakage of stored electrical charges to control gate electrodes. In one embodiment, the at least one blocking dielectric layer 502 includes aluminum oxide.

Additionally or alternatively, the at least one blocking dielectric layer 502 can include a silicon-based dielectric material such as silicon oxide, silicon oxynitride, silicon nitride, or a combination thereof. In one embodiment, the at least one blocking dielectric layer 502 can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed. Alternatively, the at least one blocking dielectric layer 502 can be omitted, and a blocking dielectric layer can be formed after formation of backside recesses by a conformal deposition process on surfaces of memory films to be subsequently formed.

Subsequently, the memory material layer 504 can be formed. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The first tunneling dielectric sub-layer 506 includes a dielectric material through which charge tunneling can be performed under suitable electrical bias conditions. As used herein, a "sub-layer" refers to a layer that is a component layer of another structure that constitutes a layer. The first tunneling dielectric sub-layer 506 is a sub-layer that is a component layer of a tunneling dielectric layer to be subsequently completed. The charge tunneling may be performed through hot-carrier injection or by Fowler-Nordheim tunneling induced charge transfer depending on the mode of operation of the monolithic three-dimensional NAND string memory device to be formed. The first tunneling dielectric sub-layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric sub-layer 506 can include a stack of a first silicon oxide layer, a silicon nitride layer, and a second silicon oxide (or a silicon oxynitride) layer, which is commonly known as an ONO stack.

In one embodiment, the ONO stack can be formed by deposition of a first silicon oxide layer, deposition of a silicon nitride layer, and oxidation of a surface portion of the silicon nitride layer into the second silicon oxide layer or a silicon oxynitride layer. The remaining portion of the silicon nitride layer that is not converted into the second silicon oxynitride layer is the silicon nitride layer within the ONO stack, and the portion of the silicon nitride layer that is converted into the second silicon oxide layer (or the silicon oxynitride layer) is the second silicon oxide layer (or the silicon oxynitride layer) within the ONO stack. In one embodiment, the first tunneling dielectric sub-layer 506 can include at least a silicon oxide layer that is substantially free of carbon and/or a silicon oxynitride layer that is substantially free of carbon. The thickness of the first tunneling dielectric sub-layer 506 can be in a range from 2 nm to 20 nm, although lesser and greater thicknesses can also be employed.

The in-process conformal dielectric material layer 576 is formed on the first tunneling dielectric sub-layer 506 by a conformal deposition process such as chemical vapor deposition (CVD) or atomic layer deposition (ALD). The in-process conformal dielectric material layer 576 can include a dielectric material that is different from the dielectric material of the innermost layer of the first tunneling dielectric sub-layer 506. For example, if the first tunneling dielectric sub-layer 506 includes an ONO stack, the in-process conformal dielectric material layer 576 can comprise a silicon nitride layer. In one embodiment, the in-process conformal dielectric material layer 576 can be a silicon nitride layer. The thickness of the in-process conformal dielectric material layer 576 can be in a range from 2 nm to 10 nm (such as from 3 nm to 6 nm), although lesser and greater thicknesses can also be employed. An inner portion (i.e., the portion facing the memory cavity 49') of the in-process conformal dielectric material layer 576 is subsequently modified in composition by a conversion process such as an oxidation process, while an outer portion (i.e., the portion that contacts the first tunneling dielectric sub-layer 506) of the in-process conformal dielectric material layer 576 is not subsequently modified.

Referring to FIG. 2D, a conversion process is performed to convert a surface portion of the in-process conformal dielectric material layer 576 into a silicon oxide liner 526. A remaining contiguous portion of the in-process conformal dielectric material layer 576 constitutes a second tunneling dielectric sub-layer 516. In one embodiment, the in-process conformal dielectric material layer 576 can be a silicon nitride layer, and an inner portion of the silicon nitride layer can be converted into a silicon oxide layer, which constitutes the silicon oxide liner 526.

The conversion of the inner portion of the silicon nitride layer into the silicon oxide layer can be performed by a process selected from thermal oxidation, plasma oxidation, and a combination thereof. The process parameters of the oxidation process can be selected such that the oxidation does not proceeds through the entirety of the in-process conformal dielectric material layer 576, i.e., such that a remaining portion of the in-process conformal dielectric material layer 576 has the same composition as initially deposited (e.g., as a silicon nitride layer). The remaining portion of the silicon nitride layer can constitute the second tunneling dielectric sub-layer 516. A stack of the second tunneling dielectric sub-layer 516 and the silicon oxide liner 526 is formed over, and directly on, the first tunneling dielectric sub-layer 506.

A combination of the first and second tunneling dielectric sub-layers (506, 516) constitute a tunneling dielectric layer (506, 516). The silicon oxide liner 526 can comprise a silicon oxide layer. The second tunneling dielectric sub-layer 516 can comprise silicon nitride. In one embodiment, the thickness of the second tunneling dielectric sub-layer 516 can be in a range from 1 nm to 5 nm (such as from 1.5 nm to 3 nm), and the thickness of the silicon oxide liner 526 can be in a range from 1 nm to 5 nm (such as from 1.5 nm to 3 nm), although lesser and greater thicknesses can also be employed for each of the second tunneling dielectric sub-layer 516 and the silicon oxide liner 526.

Referring to FIG. 2E, the silicon oxide liner 526 can be removed. In one embodiment, removal of the silicon oxide liner 526 can be performed selective to the material of the second tunneling dielectric sub-layer 516. In an illustrative example, the second tunneling-dielectric sub-layer 516 can comprise silicon nitride, the silicon oxide liner 526 can comprise silicon oxide, and removal of the silicon oxide liner 526 can be performed selective to the second tunneling dielectric sub-layer 516, for example, employing an isotropic etch process such as a wet etch process employing dilute hydrofluoric acid chemistry.

Referring to FIG. 2F, a sacrificial liner 528 can be formed over, and directly on, the tunneling dielectric layer (506, 516) in each memory opening 49. In one embodiment, the sacrificial liner 528 can comprise an amorphous or polycrystalline semiconductor material layer. In one embodiment, the sacrificial liner 528 can have a material composition that is different from the material composition of the silicon oxide liner 526. In one embodiment, the sacrificial liner 528 can include a silicon-containing semiconductor material such as amorphous silicon, polycrystalline silicon, an amorphous silicon-containing semiconductor alloy, or a polycrystalline silicon-containing semiconductor alloy.

The sacrificial liner 528 can be deposited by a conformal deposition method or a non-conformal deposition method. For example, the sacrificial liner 528 can be formed by low pressure chemical vapor deposition (LPCVD), atomic layer deposition (ALD), plasma enhanced chemical vapor deposition (PECVD), physical vapor deposition (PVD), or a combination thereof. The thickness of the sacrificial liner 528, as measured at a bottom portion of a sidewall of the sacrificial liner 528 within the memory opening, can be in a range from 1 nm to 10 nm (such as from 2 nm to 6 nm), although lesser and greater thicknesses can also be employed. The sacrificial liner 528 does not need to provide a complete coverage of the inner sidewall surfaces of the tunneling dielectric layer (506, 516), and presence of pinholes in the sacrificial liner 528 does not cause a significant problem in providing protection to the tunneling dielectric layer (506, 516) during subsequent processing steps. In one embodiment, the sacrificial liner 528 can be an amorphous silicon layer or a polycrystalline silicon layer.

Referring to FIG. 2G, a layer stack including the sacrificial liner 528, the tunneling dielectric layer (516, 506), the memory material layer 504, and the at least one optional blocking dielectric layer 502 is anisotropically etched employing at least one anisotropic etch process to physically expose a semiconductor surface of the substrate (9, 10), e.g., a semiconductor surface of the semiconductor material layer 10, underneath each memory opening. Horizontal portions of the sacrificial liner 528, the tunneling dielectric layer (516, 506), the memory material layer 504, and the at least one optional blocking dielectric layer 502 located above the top surface of the insulating cap layer 70 can be removed by the at least one anisotropic etch process. Further, the horizontal portions of the sacrificial liner 528, the tunneling dielectric layer (516, 506), the memory material layer 504, and the at least one optional blocking dielectric layer 502 at a bottom of each cavity 49' can be removed to form openings extending through remaining portions thereof.

Vertical portions of the sacrificial liner 528, the tunneling dielectric layer (516, 506), the memory material layer 504, and the at least one optional blocking dielectric layer 502 remain in each memory opening. In one embodiment, portions of the memory material layer 504 at each level of the second material layers (e.g., the sacrificial material layers 42) can constitute charge storage elements that are vertically spaced apart by complementary portions of the memory material layer 504 at the levels of the first material layers (e.g., the insulator layers 32). The memory material layer 504 can be a contiguous layer, i.e., can be a charge storage layer. Alternatively, in case recess regions are formed at each level of the second material layers prior to deposition of the memory material layer 504, the memory material layer 504 can be formed as a vertical stack of discrete annular rings that are located only at the levels of the second material layers.

A surface of the epitaxial channel portion 11 can be physically exposed underneath the opening through the sacrificial liner 528, the tunneling dielectric layer (506, 516), the memory material layer 504, and the at least one blocking dielectric layer 502. Optionally, the physically exposed portion of the epitaxial channel portion 11 can be vertically recessed. If the epitaxial channel portion 11 is omitted, then the semiconductor surface of the substrate semiconductor layer 10 may be exposed instead. The tunneling dielectric layer (506, 516) is embedded within the memory material layer 504. The memory material layer 504 can comprise a charge trapping material or a floating gate material.

The set of the tunneling dielectric layer (506, 516), the memory material layer 504, and the at least one blocking dielectric layer 502 collectively constitutes a memory film 50. In one embodiment, the sacrificial liner 528, the tunneling dielectric layer (506, 516), the memory material layer 504, and the at least one blocking dielectric layer 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2H, the sacrificial liner 528 is removed by an etch process that is selective to the dielectric material of the second tunneling dielectric sub-layer 516. The sacrificial liner 528 is removed after removal of the silicon oxide liner 526, which is performed at the processing step of FIG. 2E. In one embodiment, the sacrificial liner 528 can be removed by an isotropic etch process (such as a wet etch process) that is selective to the dielectric material of the second tunneling dielectric sub-layer 516. In an illustrative example, in case the sacrificial liner 528 comprises amorphous silicon or polysilicon and the second tunneling dielectric sub-layer 526 comprises silicon nitride, the sacrificial liner 528 can be removed by a wet etch employing tetramethylammonium hydroxide (TMAH).

Referring to FIG. 2I, a semiconductor channel layer 60L can be formed over the tunneling dielectric layer (506, 516). The semiconductor channel layer 60L can be deposited directly on the semiconductor surface of the epitaxial channel portion 11 over the substrate (9, 10), and directly on the tunneling dielectric layer (506, 516). The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art.

The semiconductor channel layer 60L is formed as a single contiguous layer having a homogeneous composition and without any interface therein. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the cavity 49' in each memory opening, or may fully fill the cavity in each memory opening.

Referring to FIG. 2J, in case the cavity 49' in each memory opening is not completely filled by the semiconductor channel layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70. For example, the horizontal portion of the semiconductor channel layer located above the top surface of the insulating cap layer 70 can be removed by a planarization process, which can employ a recess etch or chemical mechanical planarization (CMP). Each remaining portion of the semiconductor channel layer 60L within a memory opening constitutes a semiconductor channel 60, which is a vertical portion of a composite semiconductor channel that further includes a horizontal semiconductor channel to be subsequently formed in an upper portion of the substrate (9, 10), e.g., in an upper portion of the semiconductor material layer 10.

Electrical current can flow through the semiconductor channel 60 when a vertical NAND device including the semiconductor channel 60 is turned on. A tunneling dielectric 506+516 is embedded within a memory material layer 504, and laterally surrounds a portion of the semiconductor channel 60. Each adjoining set of at least one blocking dielectric layer 502, a memory material layer 504, and a tunneling dielectric 506+516 collectively constitute a memory film 50, which can store electrical charges with a macroscopic retention time. In some embodiments, at least one blocking dielectric layer 502 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62.

A drain region 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain region 63.

Figure 3A:
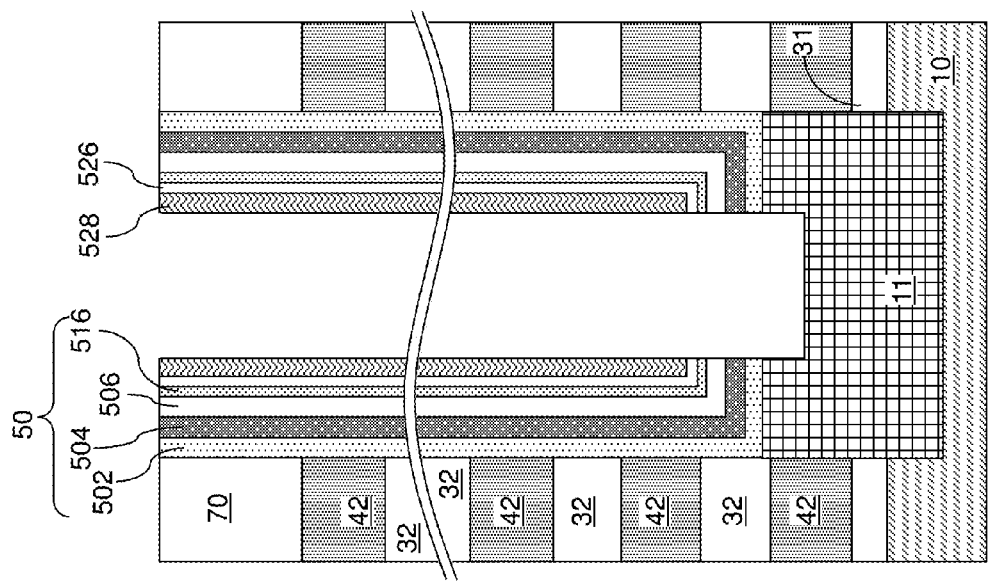

Referring to FIG. 3A, an in-process second exemplary memory stack structure according to an embodiment of the present disclosure can be derived from the first exemplary memory stack structure of FIG. 2D by skipping the processing steps of FIG. 2E, and by performing the processing steps of FIG. 2F. As discussed above, a stack of a second tunneling dielectric sub-layer 516 and a silicon oxide liner 526 is provided over the first tunneling dielectric sub-layer 506. The combination of the first and second tunneling dielectric sub-layers (506, 516) constitute a tunneling dielectric layer (506, 616). The sacrificial liner 528 can be formed over, and directly on, the silicon oxide liner 526 in each memory opening 49.

In one embodiment, the sacrificial liner 528 can comprise an amorphous or polycrystalline semiconductor material layer. In one embodiment, the sacrificial liner 528 can have a material composition that is different from the material composition of the silicon oxide liner 526. In one embodiment, the sacrificial liner 528 can include a silicon-containing semiconductor material such as amorphous silicon, polycrystalline silicon, an amorphous silicon-containing semiconductor alloy, or a polycrystalline silicon-containing semiconductor alloy.

In one embodiment, the sacrificial liner 528 can comprise silicon nitride layer. In this case, the sacrificial liner 528 can have a material composition that is different from the material composition of the silicon oxide liner 526. In one embodiment, the silicon oxide liner 526 comprises silicon oxide or silicon oxynitride, and the sacrificial liner 528 can include silicon nitride.

The sacrificial liner 528 can be deposited by a conformal deposition method or a non-conformal deposition method. For example, the sacrificial liner 528 can be formed by low pressure chemical vapor deposition (LPCVD), atomic layer deposition (ALD), plasma enhanced chemical vapor deposition (PECVD), physical vapor deposition (PVD), or a combination thereof. The thickness of the sacrificial liner 528, as measured at a bottom portion of a sidewall of the sacrificial liner 528 within the memory opening, can be in a range from 1 nm to 10 nm (such as from 2 nm to 6 nm), although lesser and greater thicknesses can also be employed. The sacrificial liner 528 does not need to provide a complete coverage of the inner sidewall surfaces of the tunneling dielectric layer (506, 516), and presence of pinholes in the sacrificial liner 528 does not cause a significant problem in providing protection to the tunneling dielectric layer (506, 516) during subsequent processing steps. The silicon oxide liner 526 provides additional protection to the tunneling dielectric layer (506, 516) during a subsequent anisotropic etch. In one embodiment, the sacrificial liner 528 can be an amorphous silicon layer or a polycrystalline silicon layer.

Figure 3B:
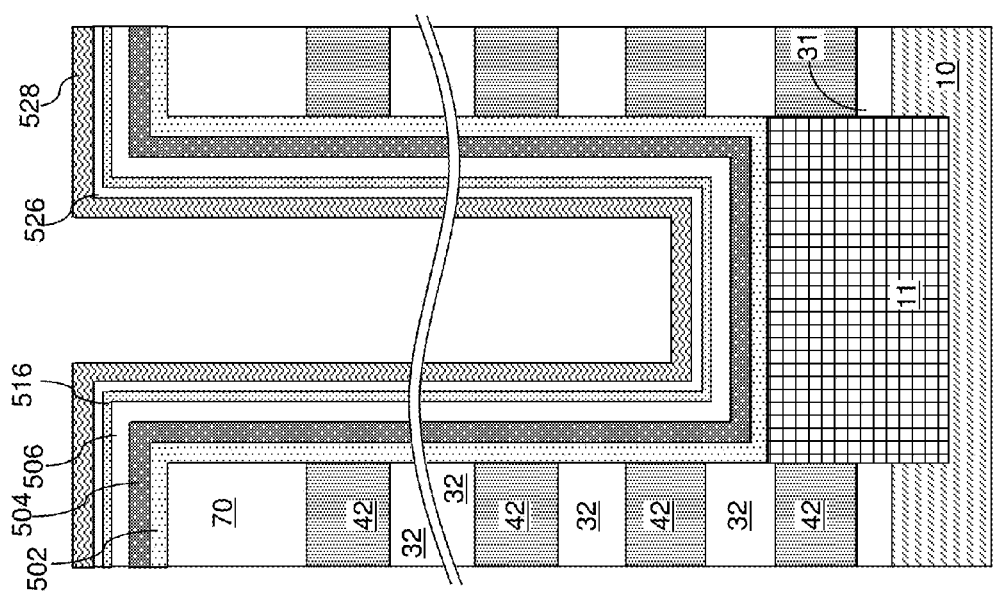

Referring to FIG. 3B, a layer stack including the sacrificial liner 528, the silicon oxide liner 526, the tunneling dielectric layer (516, 506), the memory material layer 504, and the at least one optional blocking dielectric layer 502 is anisotropically etched employing at least one anisotropic etch process to physically expose a semiconductor surface of the substrate (9, 10), e.g., a semiconductor surface of the semiconductor material layer 10, underneath each memory opening. Horizontal portions of the sacrificial liner 528, the silicon oxide liner 526, the tunneling dielectric layer (516, 506), the memory material layer 504, and the at least one optional blocking dielectric layer 502 located above the top surface of the insulating cap layer 70 can be removed by the at least one anisotropic etch process. Further, the horizontal portions of the sacrificial liner 528, the silicon oxide liner 526, the tunneling dielectric layer (516, 506), the memory material layer 504, and the at least one optional blocking dielectric layer 502 at a bottom of each cavity 49' can be removed to form openings extending through remaining portions thereof.

Vertical portions of the sacrificial liner 528, the silicon oxide liner 526, the tunneling dielectric layer (516, 506), the memory material layer 504, and the at least one optional blocking dielectric layer 502 remain in each memory opening. In one embodiment, portions of the memory material layer 504 at each level of the second material layers (e.g., the sacrificial material layers 42) can constitute charge storage elements that are vertically spaced apart by complementary portions of the memory material layer 504 at the levels of the first material layers (e.g., the insulator layers 32). The memory material layer 504 can be a contiguous layer, i.e., can be a charge storage layer. Alternatively, in case recess regions are formed at each level of the second material layers prior to deposition of the memory material layer 504, the memory material layer 504 can be formed as a vertical stack of discrete annular rings that are located only at the levels of the second material layers.

A surface of the epitaxial channel portion 11 can be physically exposed underneath the opening through the sacrificial liner 528, the tunneling dielectric layer (506, 516), the memory material layer 504, and the at least one blocking dielectric layer 502. Optionally, the physically exposed portion of the epitaxial channel portion 11 can be vertically recessed. The tunneling dielectric layer (506, 516) is embedded within the memory material layer 504. The memory material layer 504 can comprise a charge trapping material or a floating gate material.

The set of the tunneling dielectric layer (506, 516), the memory material layer 504, and the at least one blocking dielectric layer 502 collectively constitutes a memory film 50. In one embodiment, the sacrificial liner 528, the silicon oxide liner 526, the tunneling dielectric layer (506, 516), the memory material layer 504, and the at least one blocking dielectric layer 502 can have vertically coincident sidewalls.

Referring to FIG. 3C, the sacrificial liner 528 is removed by an etch process that is selective to the dielectric material of the silicon oxide liner 526. The sacrificial liner 528 is removed prior to removal of the silicon oxide liner 526, which is performed at a subsequent processing step. In one embodiment, the sacrificial liner 528 can be removed by an isotropic etch process (such as a wet etch process) that is selective to the dielectric material of the silicon oxide liner 526. In an illustrative example, in case the sacrificial liner 528 comprises amorphous silicon or polysilicon and the silicon oxide liner 526 comprises silicon oxide, the sacrificial liner 528 can be removed by a wet etch employing tetramethylammonium hydroxide (TMAH). In case the sacrificial liner 528 comprises silicon nitride and the silicon oxide liner 526 comprises silicon oxide, the sacrificial liner 528 can be removed by a wet etch employing hot phosphoric acid.

Referring to FIG. 3D, the silicon oxide liner 526 is removed by an etch process that is selective to the dielectric material of the second tunneling dielectric sub-layer 516. In an illustrative example, the second tunneling-dielectric sub-layer 506 can comprise silicon nitride, the silicon oxide liner 516 can comprise silicon oxide, and removal of the silicon oxide liner 516 can be performed selective to the second tunneling dielectric sub-layer 506, for example, employing an isotropic etch process such as a wet etch process employing dilute hydrofluoric acid chemistry.

In one embodiment, the removal of the sacrificial liner 528 and the silicon oxide liner 516 can be performed in a same wet clean equipment by sequentially flowing an etchant for etching the sacrificial liner 528 and an etchant for etching the silicon oxide liner 516. For example, if the sacrificial liner 528 includes silicon nitride and the silicon oxide liner 516 includes silicon oxide, a first etchant including hot phosphoric acid can be employed in a wet etch chamber to remove the sacrificial liner 528 and then a second etchant including dilute hydrofluoric acid can be employed in the same wet etch chamber to remove the silicon oxide liner 516. In one embodiment, the second and silicon oxide liners (528, 526) can be removed in the same wet etch chamber employing two etchants that are sequentially flowed into the wet etch chamber while the substrate remains in the wet etch chamber.

Referring to FIG. 3E, a semiconductor channel layer 60L can be formed over the tunneling dielectric layer (506, 516). Processing steps of FIG. 2I can be performed to form the semiconductor channel layer 60L. The semiconductor channel layer 60L can be deposited directly on the semiconductor surface of the epitaxial channel portion 11 over the substrate (9, 10), and directly on the tunneling dielectric layer (506, 516). The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art.

The semiconductor channel layer 60L is formed as a single contiguous layer having a homogeneous composition and without any interface therein. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the cavity 49' in each memory opening, or may fully fill the cavity in each memory opening.

Referring to FIG. 3F, a semiconductor channel 60 can be formed by planarization, and optional recessing, of the semiconductor channel layer 60L. The processing steps of FIG. 2J can be employed to form the semiconductor channel 60. In case the cavity 49' in each memory opening is not completely filled by the semiconductor channel layer 60L, a dielectric core 62 can be formed employing the processing steps of FIG. 2J. Further, the processing steps of FIG. 2J can be employed to form a drain region 63 in each memory opening.

Referring to FIG. 4A, an in-process third exemplary memory stack structure according to an embodiment of the present disclosure can be derived from the second exemplary memory stack structure of FIG. 3B by employing silicon nitride as the material of the sacrificial liner 528. In other words, the in-process third exemplary memory stack structure of FIG. 4A can be the same as the in-process second exemplary memory stack structure of FIG. 3B with the limitation that the material of the sacrificial liner 528 is silicon nitride. In one embodiment, the first tunneling dielectric sub-layer 504 can consist of a silicon oxide layer. A surface clean process can be performed after the anisotropic etch to remove residual materials from the physically exposed semiconductor surfaces of the epitaxial channel portion 11. The surface clean process can employ dilute hydrofluoric acid or a vapor phase etch employing hydrofluoric acid vapor.

Referring to FIG. 4B, an isotropic etch process can be employed to remove the sacrificial liner 528 selective to the silicon oxide liner 526. In one embodiment, the isotropic etch process can be a wet etch process employing hot phosphoric acid. In one embodiment, the physically exposed semiconductor surfaces of the epitaxial channel portion 11 can be cleaned in a first chamber of an etch process tool during the surface clean process of step 4A, and the sacrificial liner 528 can be removed in a second chamber of the etch process tool during the isotropic etch process of FIG. 4B.

Thus, in this embodiment, the first tunneling-dielectric sub-layer 506 comprises silicon oxide, the second tunneling-dielectric sub-layer 516 comprises silicon nitride, and the silicon oxide liner 526 is not removed and comprises a third tunneling-dielectric sub-layer. The tunneling dielectric layer comprises a stack (506, 516, 526) comprising the silicon oxide first tunneling-dielectric sub-layer 506, the silicon nitride second tunneling-dielectric sub-layer 516, and the silicon oxide third tunneling-dielectric sub-layer 526.

Referring to FIG. 4C, the processing steps of FIG. 3E can be performed to form a semiconductor channel layer 60L. Referring to FIG. 4D, the processing steps of FIG. 3F can be performed to form a semiconductor channel 60, a dielectric core 62, and a drain region 63 within the cavity 49' that is present in each memory opening 49.

Figure 5:
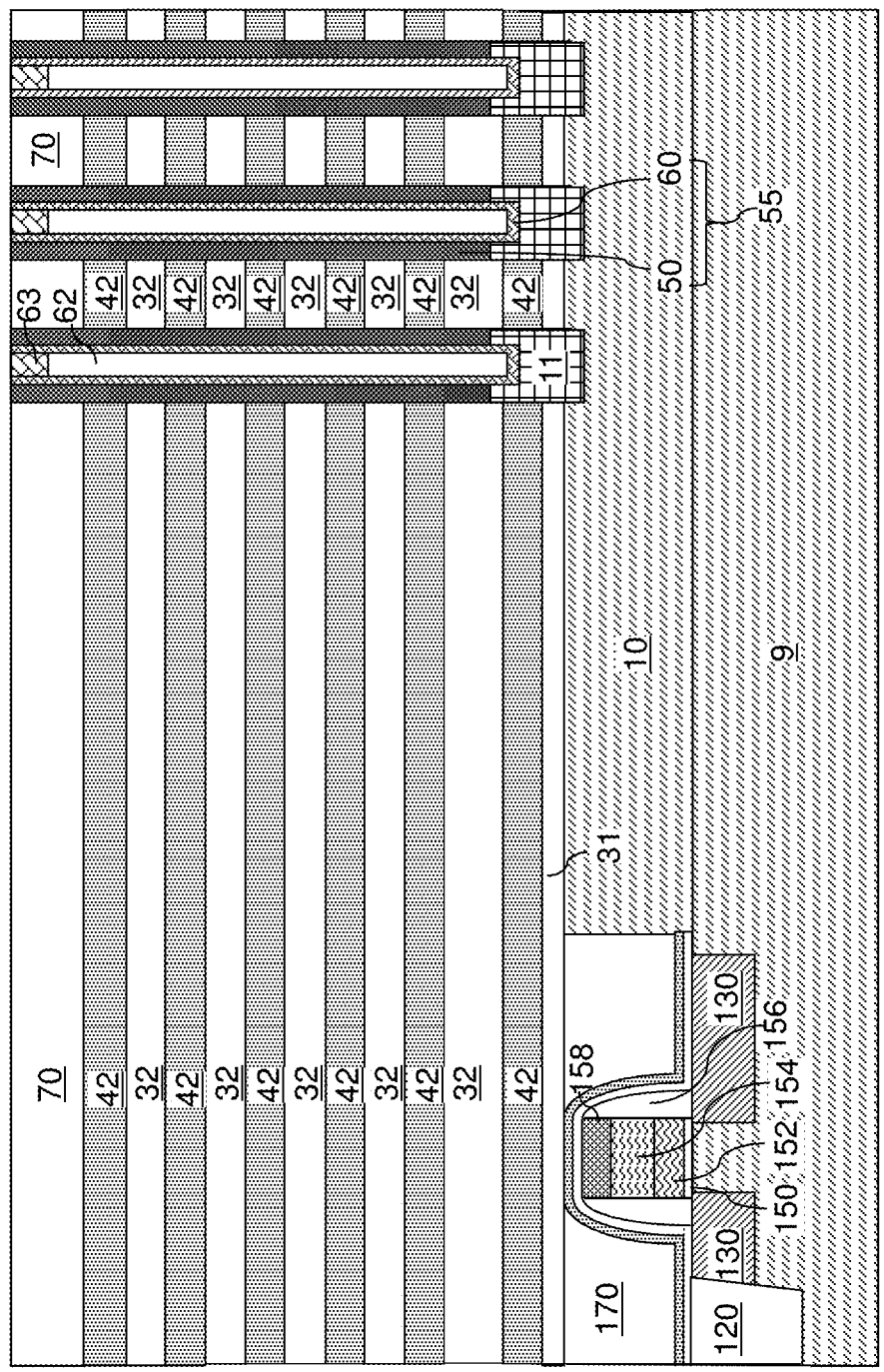
FIG. 5 is a vertical cross-sectional view of the exemplary structure after formation of memory stack structures according to an embodiment of the present disclosure.

Multiple instances of the first or second exemplary memory stack structure can be embedded into the memory openings 49 in the exemplary structure illustrated in FIG. 1. FIG. 5 illustrates the exemplary structure that incorporates multiple instances of the exemplary memory stack structure of FIG. 2J or FIG. 3F. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises at least one blocking dielectric layer 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 6:
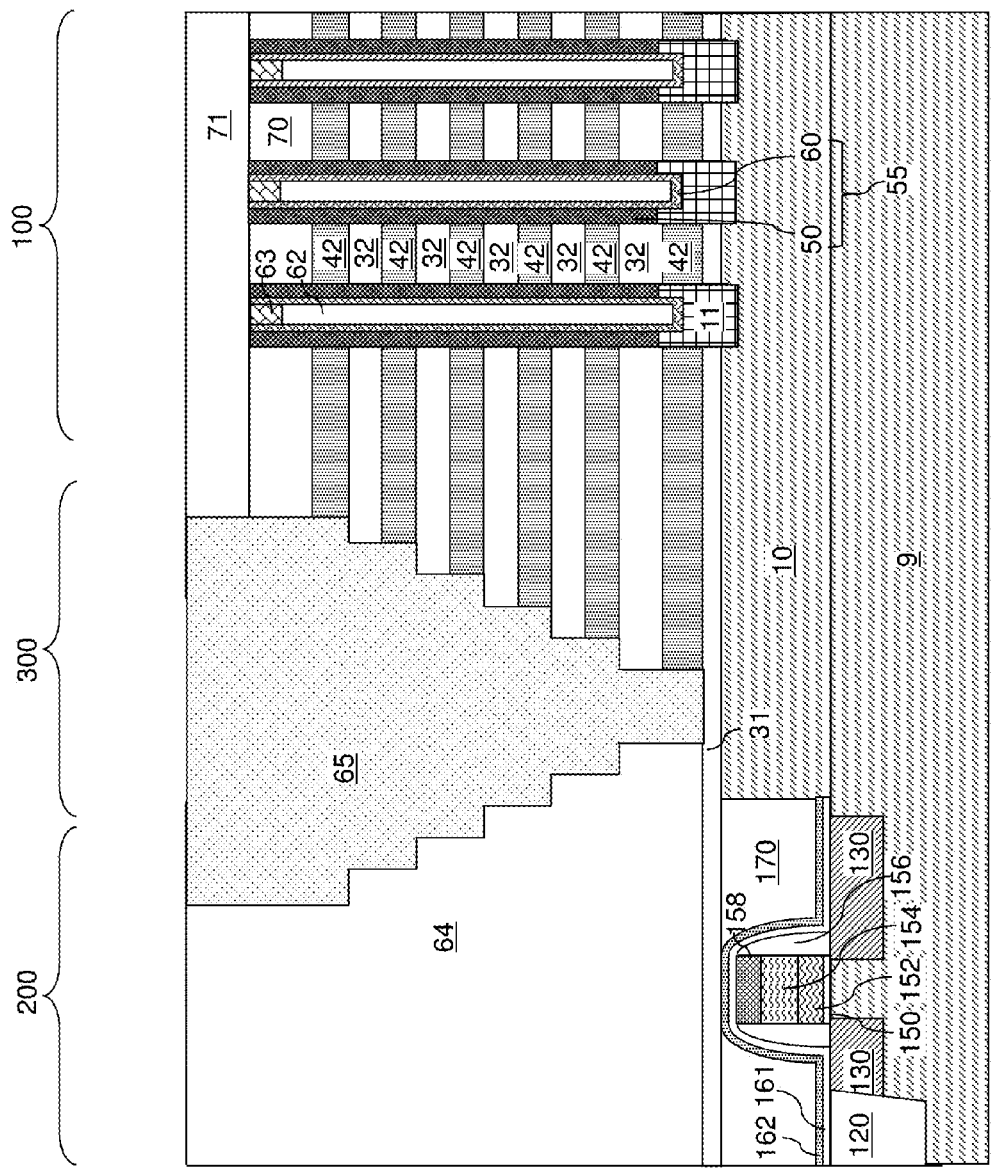
FIG. 6 is a vertical cross-sectional view of the exemplary structure after formation of a stepped terrace and a retro-stepped dielectric material portion according to an embodiment of the present disclosure.

Referring to FIG. 6, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7A:
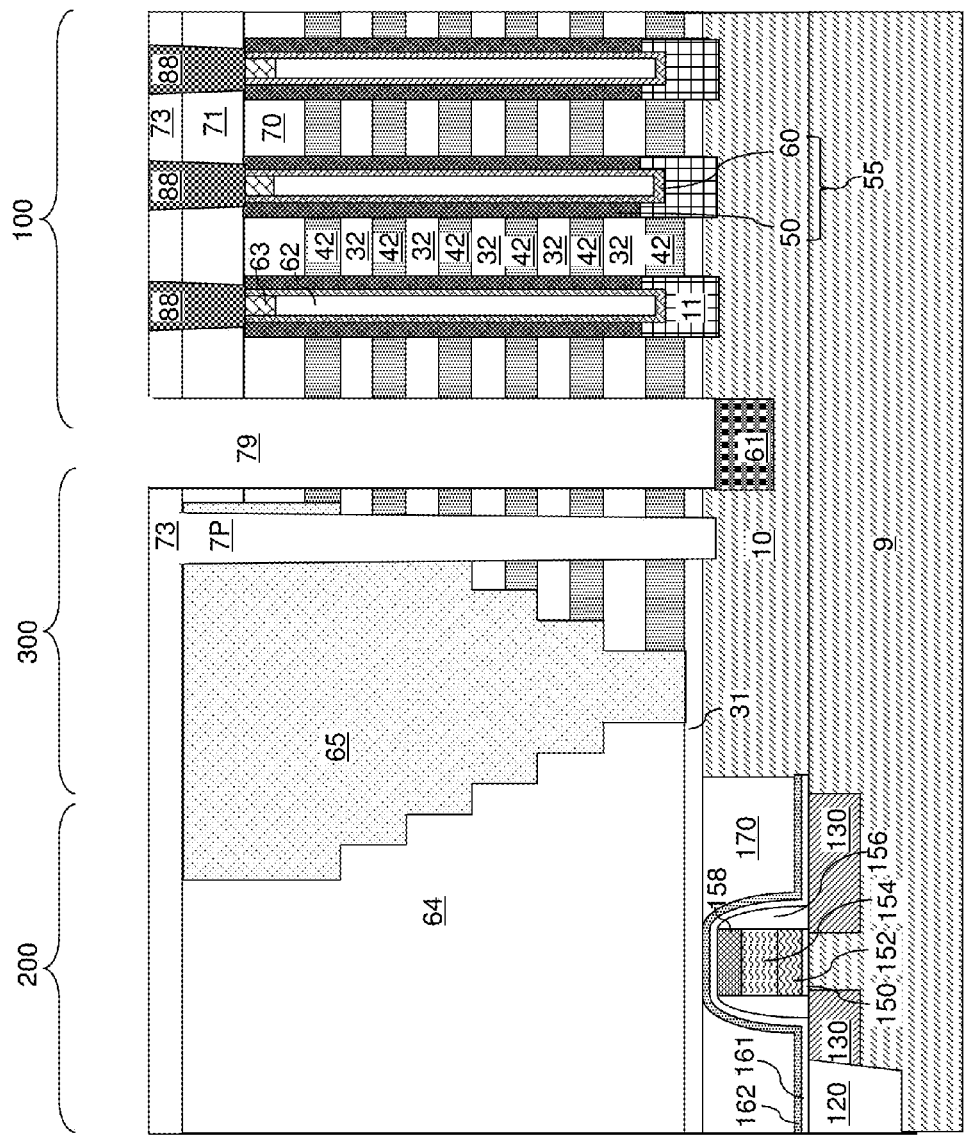
FIG. 7A is a vertical cross-sectional view of the exemplary structure after formation of a backside contact trench according to an embodiment of the present disclosure.
Figure 7B:
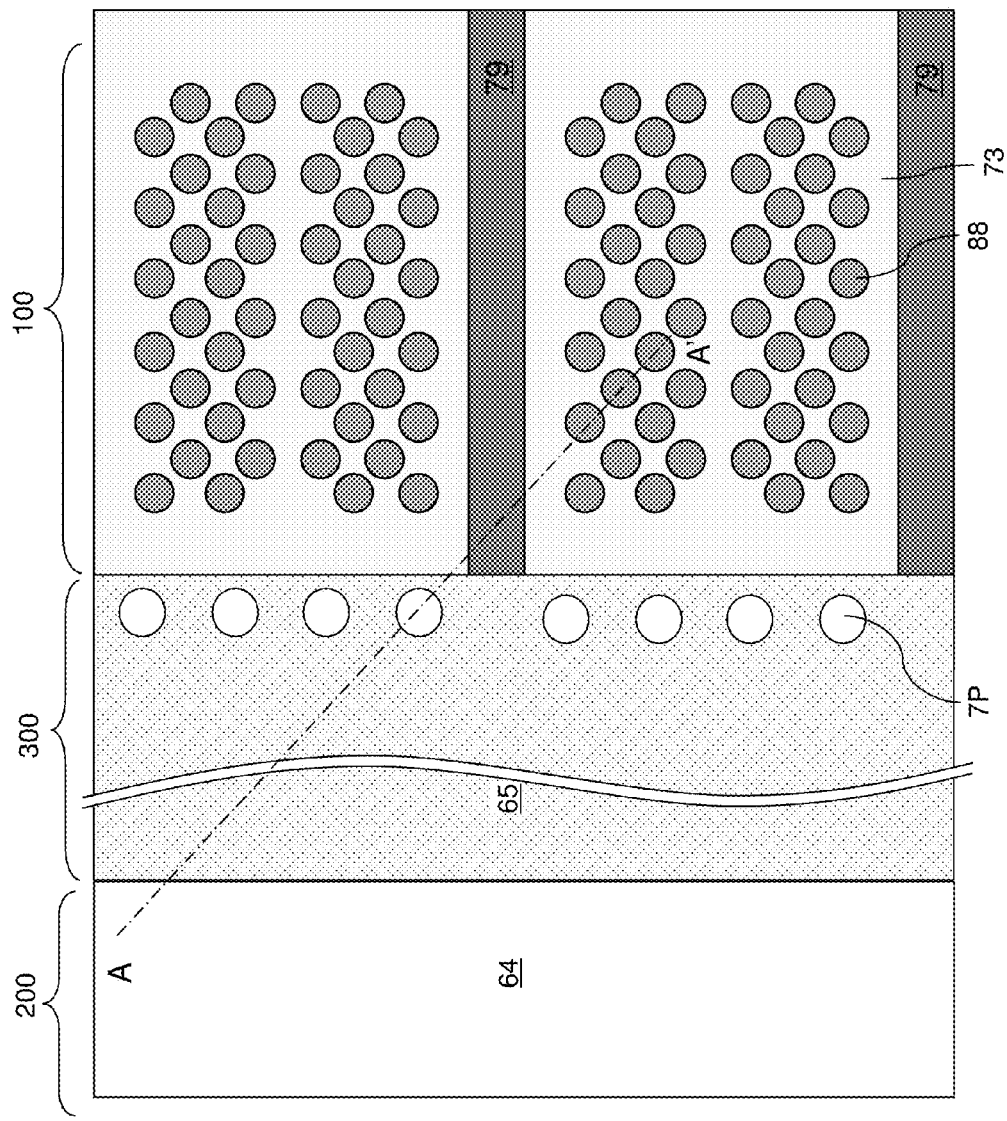
FIG. 7B is a partial see-through top-down view of the exemplary structure of FIG. 7A. The vertical plane A-A' is the plane of the vertical cross-sectional view of FIG. 7A.

Referring to FIGS. 7A and 7B, at least one dielectric support pillar 7P may be optionally formed through the retro-stepped dielectric material portion 65 and/or through the first contact level dielectric layer 71 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing. Alternatively, the memory contact via structure 88 may be formed at a later step in the process shown in FIG. 11.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 8:
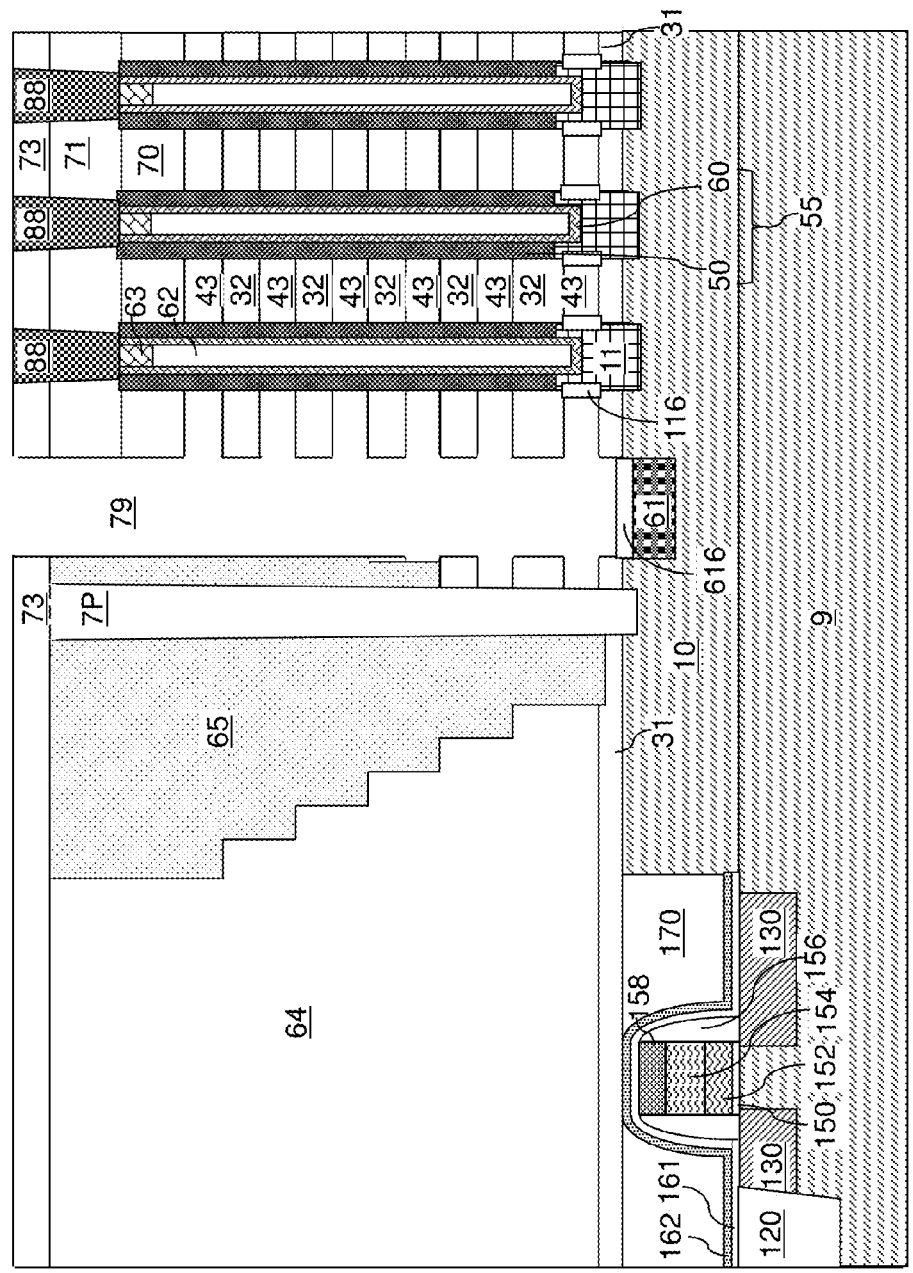
FIG. 8 is a vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the planar dielectric layer 31, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 9:
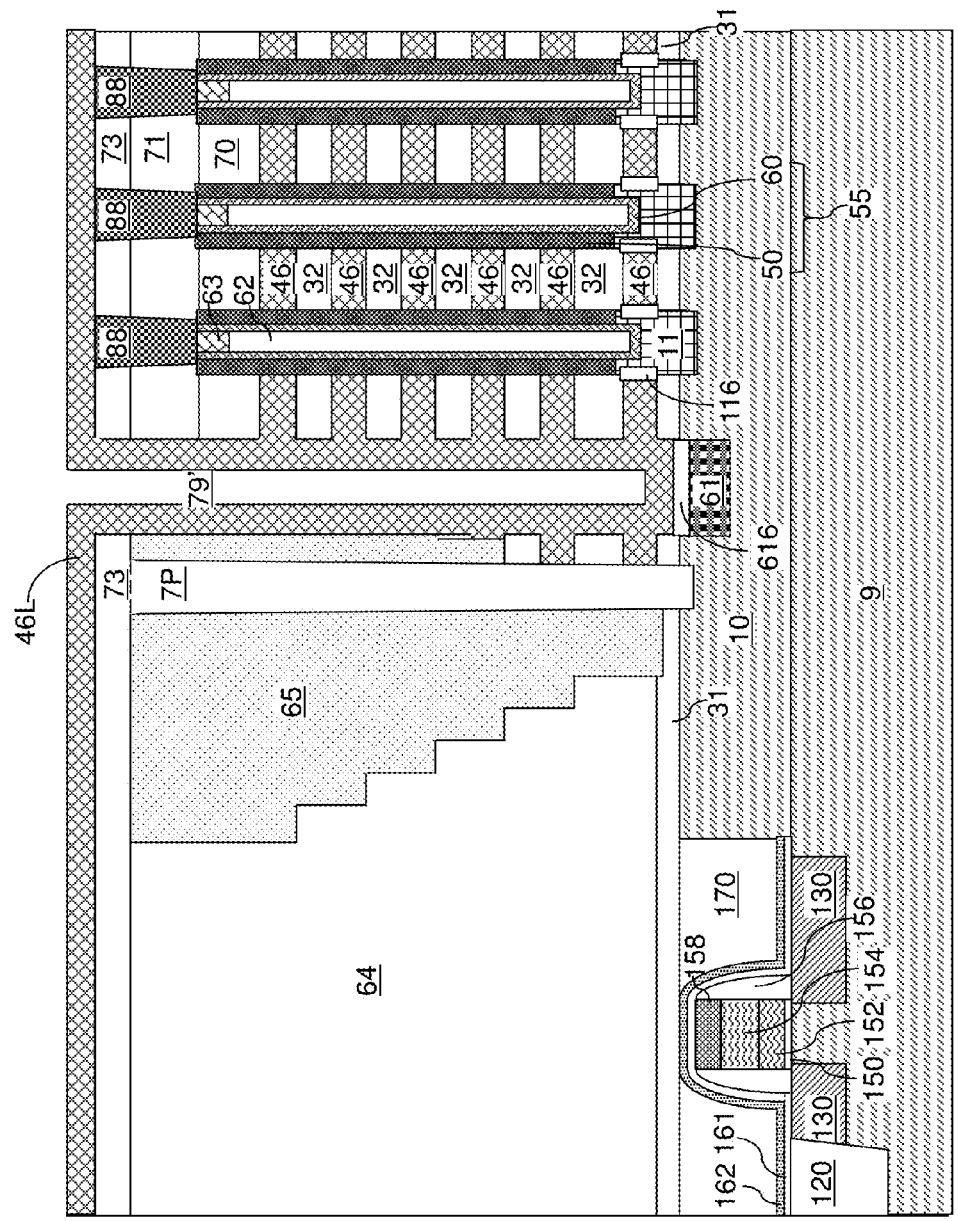
FIG. 9 is a vertical cross-sectional view of the exemplary structure after formation of electrically conductive layers according to an embodiment of the present disclosure.

Referring to FIG. 9, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric 502 is present within each memory opening, the backside blocking dielectric layer is optional. In case a blocking dielectric layer 502 is omitted, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71, 73). Thus, each sacrificial material layer 42 can be replaced with an electrically conductive layer 46. A backside cavity 79' is present in the portion of each backside contact trench 79 that is not filled with the contiguous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition or atomic layer deposition.

Figure 10:
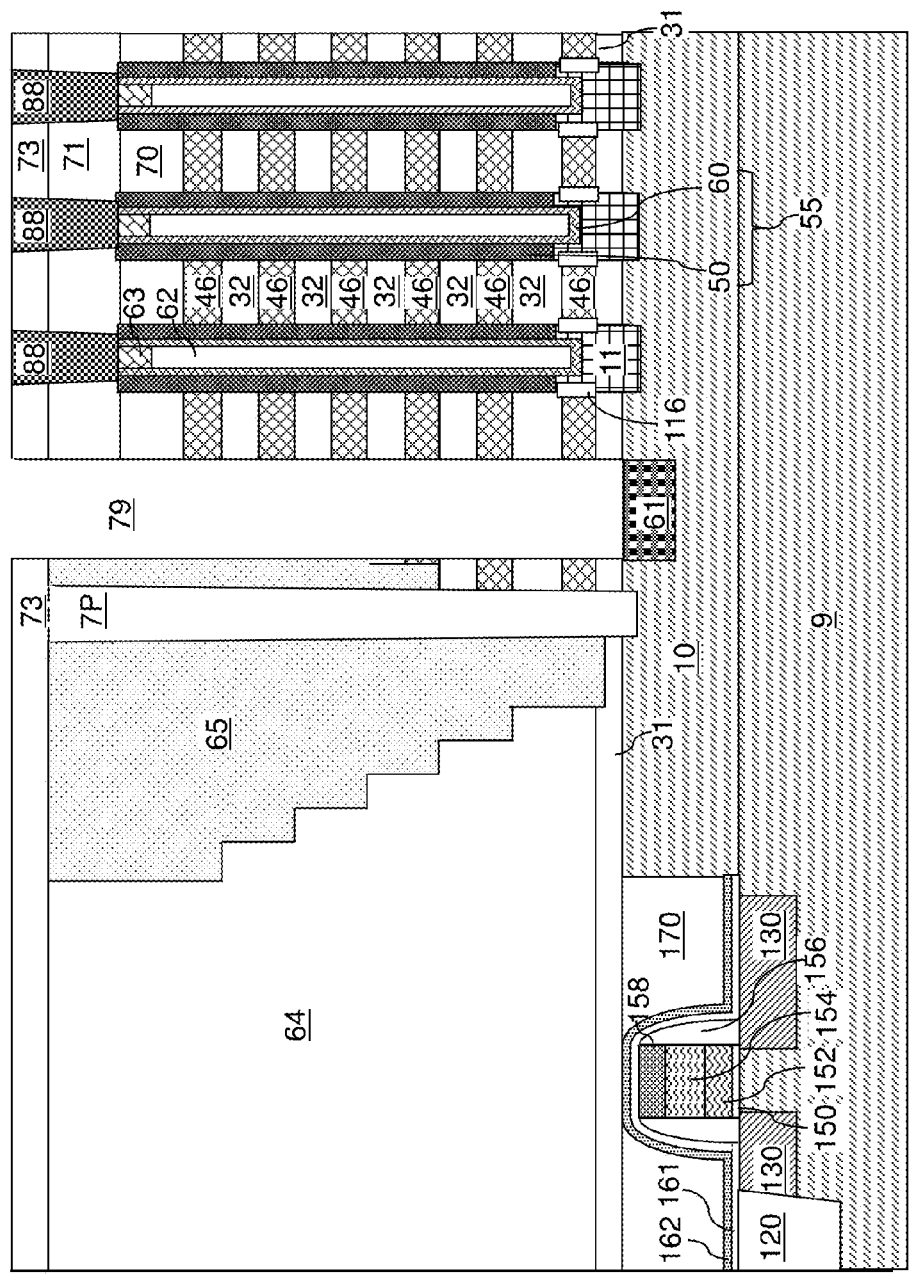
FIG. 10 is a vertical cross-sectional view of the exemplary structure after removing excess conductive material portions according to an embodiment of the present disclosure.

Referring to FIG. 10, the deposited metallic material of the contiguous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch.

In case the spacer material layers (i.e., the second material layers) are conductive material layer at the time of formation (i.e., as formed at the processing steps of FIG. 1), replacement of the spacer material layers with electrically conductive layers not necessary. In this case, the processing steps of FIGS. 7-9 can be omitted.

Figure 11:
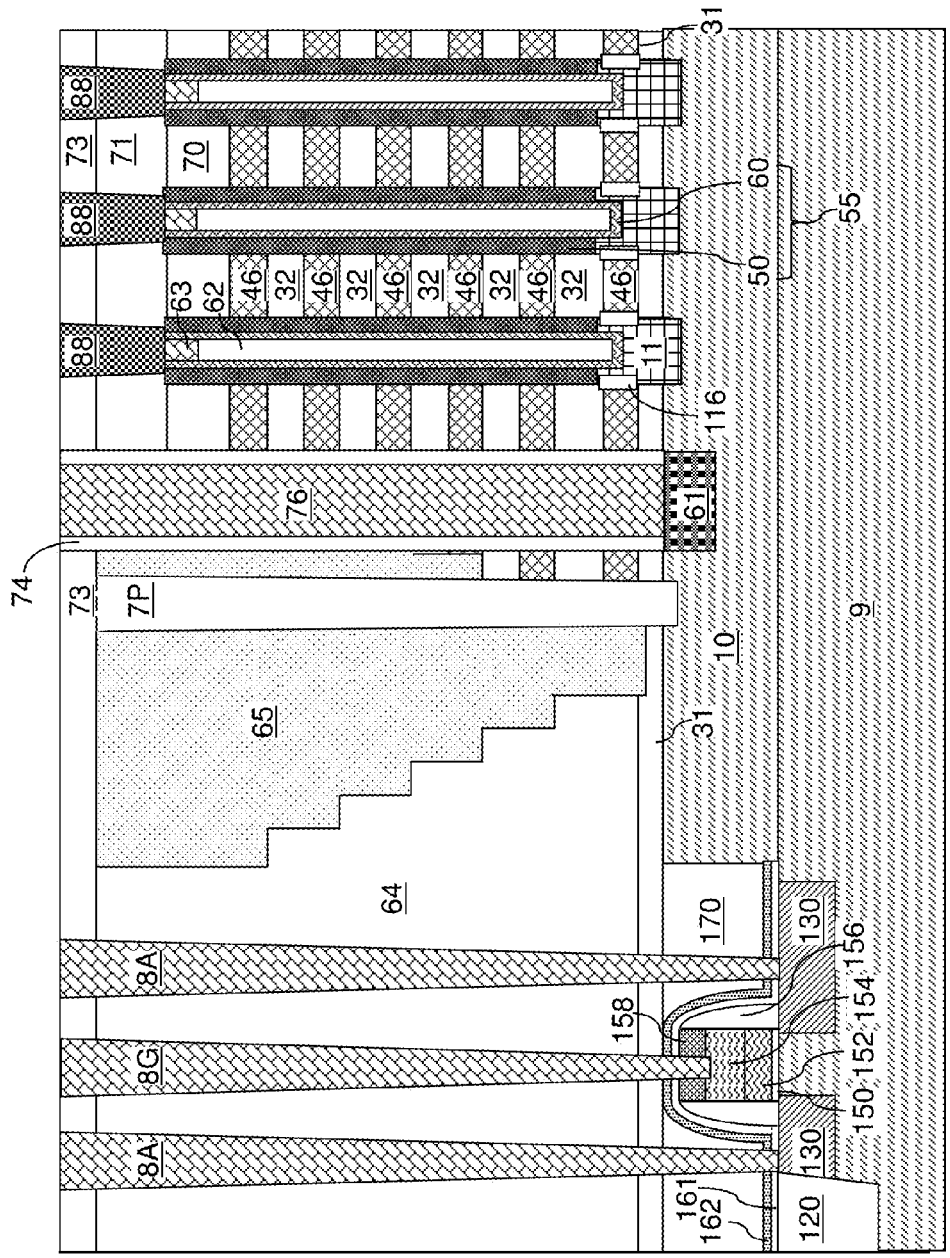
FIG. 11 is a vertical cross-sectional view of the exemplary structure after formation of various contact via structures according to an embodiment of the present disclosure.

Referring to FIG. 11, an insulating material layer 74 can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer 74 includes an insulating material such as silicon oxide, silicon nitride, a dielectric metal oxide, an organosilicate glass, or a combination thereof. The thickness of the insulating material layer 74 can be in a range from 1.5 nm to 60 nm, although lesser and greater thicknesses can also be employed.

An anisotropic etch is performed to remove horizontal portions of the insulating material layer 74 from above the second contact level dielectric layer 73. Each remaining portion of the insulating material layer 74L inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

Various contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A. The memory contact via structures 88 may also be formed during the same step as via structures (8G, 8A). Likewise, word line contact via structures (not shown for clarity) to word lines may also be formed during the same step.

The exemplary structure includes a monolithic three-dimensional memory device. The monolithic three-dimensional memory device comprises a stack of alternating layers comprising insulating layers 32 and electrically conductive layers 46 and located over a substrate (9, 10, 61), an array of memory openings extending through the stack; and a plurality of memory stack structures 55 located within a respective memory opening. Each electrically conductive layer 46 can laterally surround the plurality of memory stack structures 55. Each memory stack structure 50 extends through the stack of alternating layers. Each memory stack structure 50 comprising a memory material layer 504, and a tunneling dielectric layer (506, 516). A semiconductor channel 60 extends through the memory stack structure 50. The tunneling dielectric layer (506, 516) can comprise an ONO stack (as embodied as a first tunneling dielectric sub-layer 506) and a silicon nitride layer (as embodied as a second tunneling dielectric sub-layer 516) that contacts the semiconductor channel 60. In one embodiment, the semiconductor channel 60 can be a single contiguous layer having a homogeneous composition and without any interface therein, and laterally surrounds, and contacts, a dielectric core 62.

In one embodiment, the memory device of the present disclosure can be a monolithic three-dimensional memory device comprising a vertical NAND device located over the substrate (9, 10, 61), and the electrically conductive layers (44, 46) can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10). In one embodiment, the plurality of semiconductor channels can comprise a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The present disclosure provides various methods for eliminating, or reducing, charge scattering trap density within a semiconductor channel inside a memory stack structure. Thus, the methods of the present disclosure can be employed to enhance the on-current of three-dimensional memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a semiconductor device, comprising:
   forming a stack of alternating layers comprising insulating layers and spacer material layers over a substrate;
   forming a memory opening through the stack;
   forming a memory material layer and a first tunneling dielectric sub-layer over the memory material layer in the memory opening;
   forming a stack of a second tunneling dielectric sub-layer and a silicon oxide liner over the first tunneling dielectric sub-layer in the memory opening;
   forming a sacrificial liner in the memory opening;
   anisotropically etching a layer stack including at least the sacrificial liner, a tunneling dielectric layer, and the memory material layer to physically expose a semiconductor surface underneath the memory opening, wherein the tunneling dielectric layer comprises at least a combination of the first and second tunneling dielectric sub-layers;
   removing the sacrificial liner and the silicon oxide liner; and
   forming a semiconductor channel layer directly on the tunneling dielectric layer.

2. The method of claim 1, wherein the silicon oxide liner is removed prior to forming the semiconductor channel layer.

3. The method of claim 2, wherein the second tunneling dielectric sub-layer comprises silicon nitride.

4. The method of claim 3, wherein the stack of the second tunneling dielectric sub-layer and the silicon oxide liner is formed by:
   depositing a silicon nitride layer over the first tunneling dielectric sub-layer; and
   converting an inner portion of the silicon nitride layer into the silicon oxide layer, wherein a remaining portion of the silicon nitride layer constitutes the second tunneling dielectric sub-layer.

5. The method of claim 4, wherein the first tunneling dielectric sub-layer comprises an ONO stack.

6. The method of claim 4, wherein conversion of the inner portion of the silicon nitride layer into the silicon oxide layer is performed by a process selected from thermal oxidation, plasma oxidation, and a combination thereof.

7. The method of claim 1, wherein the sacrificial liner comprises an amorphous or polycrystalline semiconductor material layer.

8. The method of claim 2, wherein the silicon oxide liner is removed prior to formation of the sacrificial liner and prior to anisotropically etching the layer stack.

9. The method of claim 8, wherein:
   the second tunneling-dielectric sub-layer comprises silicon nitride;
   the silicon oxide liner comprises silicon oxide; and
   removal of the silicon oxide liner is performed selective to the second tunneling dielectric sub-layer.

10. The method of claim 1, wherein the silicon oxide liner is removed after removal of the sacrificial liner and after anisotropically etching the layer stack.

11. The method of claim 10, wherein:
    the second tunneling dielectric sub-layer comprises silicon nitride;
    the silicon oxide liner comprises silicon oxide; and
    removal of the sacrificial liner is performed selective to the silicon oxide liner.

12. The method of claim 1, wherein:
    the first tunneling-dielectric sub-layer comprises silicon oxide;
    the second tunneling-dielectric sub-layer comprises silicon nitride;

the silicon oxide liner is not removed and comprises a third tunneling-dielectric sub-layer; and the tunneling dielectric layer comprises a stack comprising the silicon oxide first tunneling-dielectric sub-layer, the silicon nitride second tunneling-dielectric sub-layer and the silicon oxide third tunneling-dielectric sub-layer.

13. The method of claim 12, wherein the sacrificial liner comprises silicon nitride.

14. The method of claim 13, further comprising:
cleaning the physically exposed semiconductor surface in a first chamber of an etch process tool; and
removing the sacrificial liner in a second chamber of the etch process tool.

15. The method of claim 1, wherein the semiconductor channel layer is formed as a single contiguous layer having a homogeneous composition and without any interface therein.

16. The method of claim 1, further comprising:
forming a blocking dielectric layer on a sidewall of the memory opening, wherein the memory material layer is deposited on the blocking dielectric layer;
forming a dielectric core directly on an inner surface of the semiconductor channel layer;
removing a portion of the semiconductor channel layer from above the stack of alternating layers, wherein a remaining portion of the semiconductor channel layer constitutes a semiconductor channel; and
forming a drain region in an upper portion of the memory opening and on the semiconductor channel.

17. The method of claim 1, wherein:
the semiconductor device is a three-dimensional memory device; and
the spacer material layers comprise conductive material layers that are subsequently patterned into control gate electrodes of the three-dimensional memory device.

18. The method of claim 1, wherein:
the semiconductor device is a three-dimensional memory device; and
the spacer material layers comprise sacrificial material layers; and
the method comprises removing the sacrificial material layers selective to the insulator layers to form lateral recesses, and subsequently filling the lateral recesses with conductive material layers.

19. The method of claim 18, further comprising:
forming a backside contact trench through the stack of alternating layers, wherein removal of the sacrificial material layers is performed by introducing an etchant through the backside contact trench;
forming an insulating spacer on a sidewall of the backside contact trench after formation of the electrically conductive layers; and
forming a backside contact via structure within a portion of the backside contact trench that is not filled with the insulating spacer.

20. The method of claim 1, wherein the sacrificial liner and the silicon oxide liner are removed in a same wet etch chamber employing two etchants that are sequentially flowed into the wet etch chamber while the substrate remains in the wet etch chamber.

21. The method of claim 1, wherein:
the semiconductor device is a monolithic three-dimensional memory device comprising a vertical NAND device located over the substrate;

the electrically conductive layers comprise, or are electrically connected to, a respective word line of the vertical NAND device;
the substrate comprises a silicon substrate;
the vertical NAND device comprises an array of monolithic three-dimensional NAND strings located over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

22. The method of claim 1, wherein the method includes at least one feature selected from:
a first feature that removal of the silicon oxide liner is performed prior to forming the semiconductor channel;
a second feature that removal of the silicon oxide liner is performed prior to formation of the sacrificial liner and prior to anisotropically etching the layer stack and the sacrificial liner comprises an amorphous or polycrystalline semiconductor material layer; and
a third feature that removal of the silicon oxide liner is performed after removal of the sacrificial liner and after anisotropically etching the layer stack.

23. A monolithic three-dimensional memory device, comprising:
a stack of alternating layers comprising insulator layers and electrically conductive layers and located over a semiconductor substrate;
a memory stack structure extending through the stack of alternating layers, the memory stack structure comprising a memory material layer, a tunneling dielectric layer; and
a semiconductor channel located within the memory stack structure, wherein:
the tunneling dielectric layer comprises an ONO stack and a silicon nitride layer that contacts the semiconductor channel,
wherein:
the semiconductor substrate comprises a silicon substrate;
the three-dimensional memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and each NAND string comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a strip shape extending substantially parallel to the top surface of the silicon substrate, the plurality of control gate electrodes comprise at least a first control gate electrode located in the first device level and a second control gate electrode located in the second device level.

24. The monolithic three-dimensional memory device of claim 23, wherein the semiconductor channel layer is a single contiguous layer having a homogeneous composition and without any interface therein, and laterally surrounds, and contacts, a dielectric core.

25. A method of manufacturing a semiconductor device, comprising:
forming a stack of alternating layers comprising insulating layers and spacer material layers over a substrate;
forming a memory opening through the stack;
forming a memory material layer and a first tunneling dielectric sub-layer over the memory material layer in the memory opening;
forming a stack of a second tunneling dielectric sub-layer and a silicon oxide liner over the first tunneling dielectric sub-layer in the memory opening;
forming a sacrificial liner in the memory opening;
anisotropically etching a layer stack including at least the sacrificial liner, a tunneling dielectric layer, and the memory material layer to physically expose a semiconductor surface underneath the memory opening, wherein the tunneling dielectric layer comprises at least a combination of the first and second tunneling dielectric sub-layers;
removing the sacrificial liner; and
forming a semiconductor channel layer directly on the tunneling dielectric layer, wherein:
the semiconductor device is a monolithic three-dimensional memory device comprising a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings located over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *